United States Patent [19]

Bernstein et al.

[11] 4,394,736

[45] Jul. 19, 1983

[54] DATA PROCESSING SYSTEM UTILIZING A UNIQUE TWO-LEVEL MICROCODING TECHNIQUE FOR FORMING MICROINSTRUCTIONS

[75] Inventors: David H. Bernstein, Ashland, Mass.; Richard A. Carberry, Cupertino, Calif.; Michael B. Druke, Chelmsford; Ronald I. Gusowski, Westboro, both of Mass.

[73] Assignee: Data General Corporation, Westboro, Mass.

[21] Appl. No.: 120,272

[22] Filed: Feb. 11, 1980

[51] Int. Cl.³ .............................................. G06F 9/22
[52] U.S. Cl. .................................................. 364/200
[58] Field of Search ... 364/200 MS File, 900 MS File

[56] References Cited

U.S. PATENT DOCUMENTS 3,599,176 8/1971 Cordero, Jr. ...................... 364/200
4,130,869 12/1978 Kinoshita et al. .................. 364/200
4,231,085 10/1980 Bazlen et al. ...................... 364/200
4,254,461 3/1981 Chemla et al. .................... 364/200

Primary Examiner—Harvey E. Springborn
Attorney, Agent, or Firm—Robert F. O'Connell

[57] ABSTRACT

A data processing system using microcode architecture in which a two-level microcode system comprises one or more first, or "horizontal", microinstructions and a plurality of second or "vertical", microinstruction portions in a vertical microcontrol store. In a preferred embodiment the vertical microinstruction portions include one or more "modifier" fields, a selection field for selecting a horizontal microinstruction and a sequencing field for selecting the next vertical microinstruction portion of a sequence thereof, one or more fields of the horizontal microinstructions being capable of modification by the vertical modifier fields in order to form output microinstructions for performing data processing operations.

10 Claims, 17 Drawing Figures

| T-PERIOD (mS) | COUNT REQUIRED FOR 1MHz OUTPUT | HIGH-COUNT POSITION | PARSING ALGORITHM 1 2 3 4 5 6 7 8 9 10 11 12 13 A B A C A B A D A B A C A | SEQUENCE (RECYCLE TIME) CYCLE TIME | MAXIMUM ERROR |
|---|---|---|---|---|---|
| 300 | 3 3/9 | B.C | 3 4 3 4 3 4 3 3 3 | 9 μS | +300mS |
| 325 | 3 1/13 | D | 3 3 3 3 3 3 3 4 3 3 3 3 3 | 13 μS | ±125mS |
| 350 | 2 6/2 | A.B | 3 3 3 2 3 3 3 | 7 μS | ±150mS |
| 375 | 2 6/9 | A.D | 3 2 3 2 3 2 3 3 3 | 9 μS | −375mS |
| 400 | 2 1/2 | A | 3 2 | 2 μS | +200mS |
| 450 | 2 2/0 | B | 2 3 2 2 2 3 2 2 2 | 9 μS | +300mS |
| 500 | 2 | D | 2 | − | 0mS |
| 600 | 1 6/9 | A.D | 2 1 2 1 2 1 2 2 2 | 9 μS | −600mS |

VERTICAL SEQUENCER 33

MICRO-MODIFICATION UNIT 34

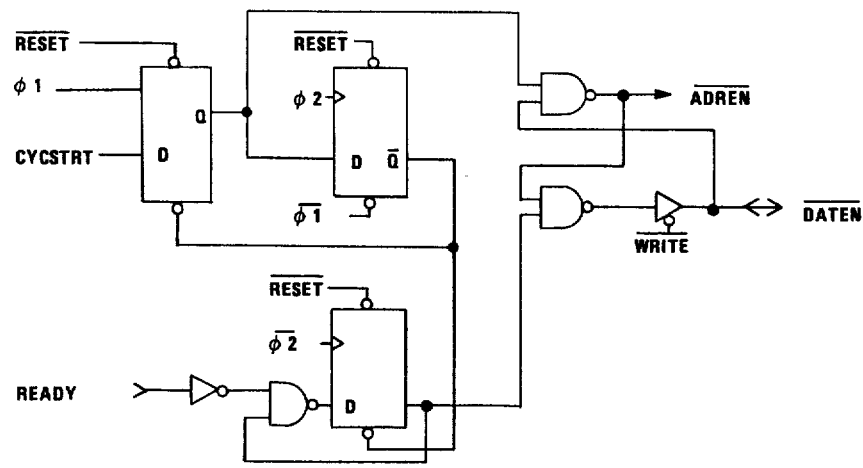
FIG. 5
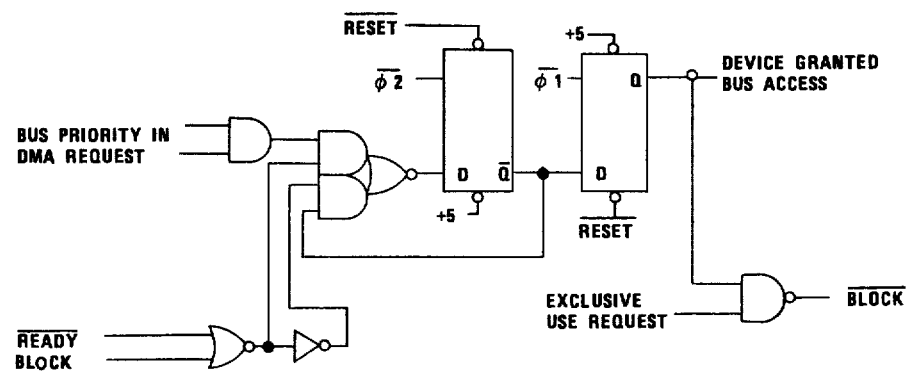
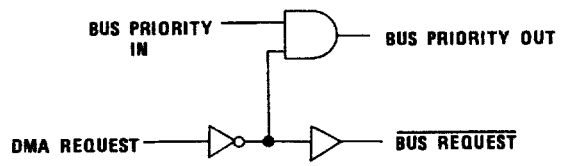
FIG. 7

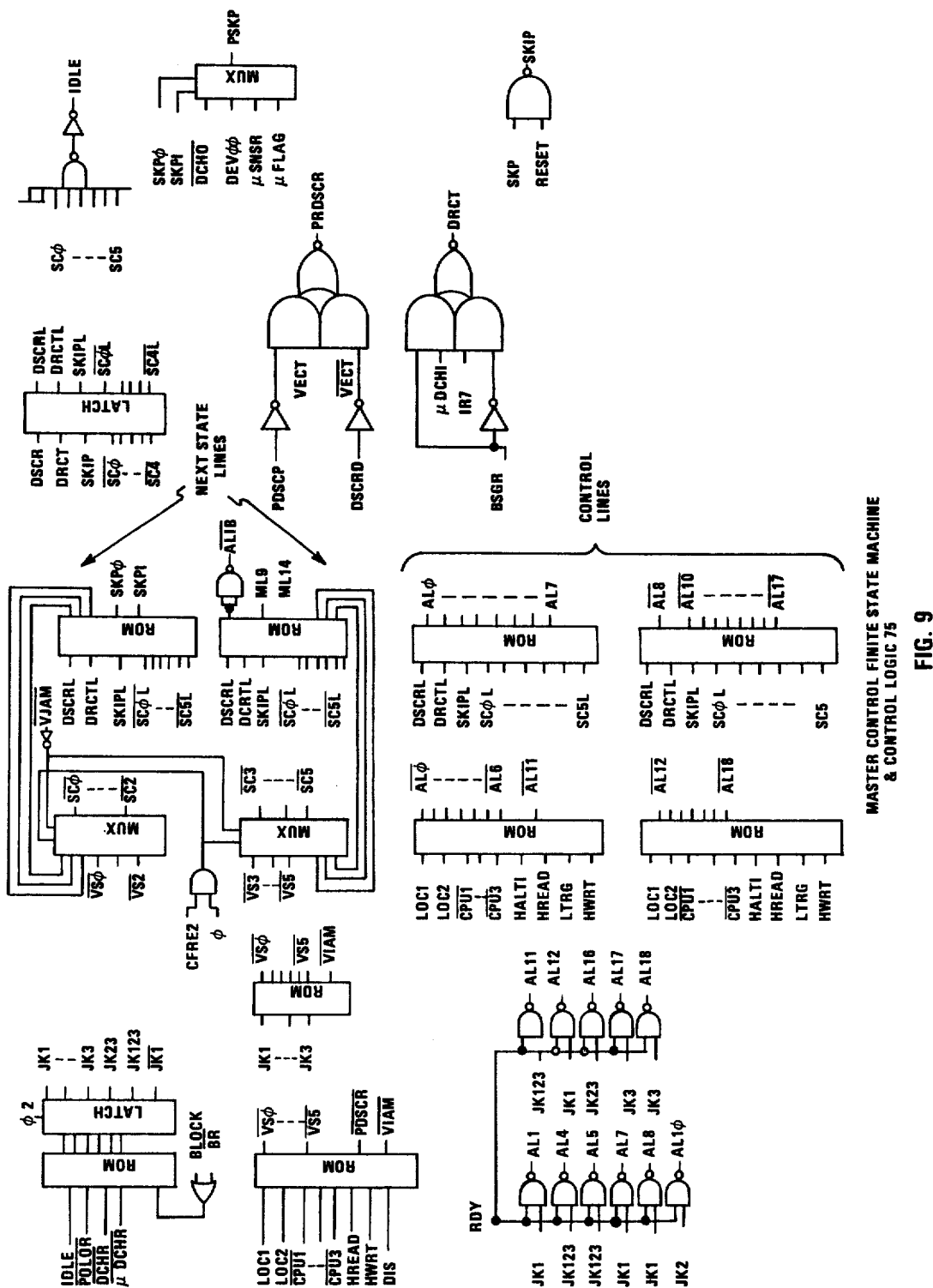

POLL COUNTER 68 & SHIFT
REGISTER 69, 77

POLL STORE 73

DATA PROCESSING SYSTEM UTILIZING A UNIQUE TWO-LEVEL MICROCODING TECHNIQUE FOR FORMING MICROINSTRUCTIONS

This invention relates to data processing systems using micro-processors and, more particularly, to systems using two-level microcode architecture.

BACKGROUND OF THE INVENTION

Data processing systems have generally been developed to provide system configurations which range from compact, single-board microcomputers to more complex, high performance minicomputers. Such systems use microcode architecture in which macroinstructions are suitably decoded so as to provide access to a microinstruction or to a sequence of more than one microinstruction obtained from a suitable data store thereof.

Generally, in such systems, for example, a macroinstruction is appropriately supplied from a macroinstruction register to suitable decoding logic so as to provide a starting address for access in the microinstruction data store (sometimes referred to as the microcode store) of an initial microinstruction of a sequence thereof. The accessed microinstruction includes control information for performing the instruction designated and sequence information for determining the microaddress of the next microinstruction of the sequence. Each sequential microinstruction contains the same kind of information until the last microinstruction of the sequence has been accessed at which point the microinstruction routine having been completed, the system is ready to decode the next macroinstruction.

Such systems normally require a relatively large microcode data store utilizing microinstruction words which are relatively wide (i.e., they contain a relatively large number of bits) so as to contain the required control and sequencing information. While the use of relatively wide microinstruction words provides higher speed operation (i.e., a large number of bits are simultaneously available in parallel to provide the control and sequencing operations) such systems tend to be more costly not only because the number of storage bits in the microcode data store becomes relatively high but the data paths for handling a wide microinstruction word become more complex and the system requires more expensive components and data path configurations.

In order to reduce the data storage space required for the microinstructions and to avoid handling a large number of "wide" instruction words, certain microcode systems have utilized "two-level" microcode store techniques as opposed to one level microcode stores as discussed above. Such two-level configurations arise from the recognition that control information in the microinstruction words are often common to a large number of the microinstructions. Therefore, in order to avoid the repetitive storage of the same relatively large number of data bits required to store all of the control and sequencing information for each microinstruction separately, control information, which is common to many microinstructions, is stored in one ROM store separately from sequencing information which is stored in a different ROM store. At the "first level" of operation the sequencing process is performed at the sequence microcode store ROM to produce sequential addresses to access control information in the control microcode store ROM which at the "second level" of operation provides the control information required to sequentially perform the particular microinstruction involved, which latter information may be common to many microinstructions.

Such two-level approach tends to reduce the microcode storage space required in comparison with one-level microcode systems. Such two-level technique, however, may tend to provide only a limited microcode operational capability since the limited control store capacity may permit the system to be designed for a specified set of microinstructions with no real flexibility for providing for expansion of the basic microinstruction set in order to increase the operational capability of the overall system.

SUMMARY OF THE INVENTION

This invention utilizes an extension of the two-level concept which increases the power of a two-level microcode system in that it provides a capability for greatly expanding the microinstruction set without increasing the size of the microcode control store. In accordance therewith, the system includes what has been termed an "orthogonal" microcontrol store in which a first, or "vertical", microcontrol store provides a "narrow" microinstruction word portion having one field comprising a selected number of vertical microinstruction bits for selecting one of a plurality of second or "horizontal" microinstructions from a second level, or horizontal, microcontrol store, one or more "modifier" fields, as described more fully below, and a sequencing field for presenting the address of the next (i.e., each successive) vertical microinstruction in a sequence thereof. Each horizontal microinstruction represents a basic function to be performed but, unlike prior systems, one or more of the fields thereof are subject to modification by the modifier field of the vertical microinstructions. For example, prior two-level systems use a vertical sequence store which merely specifies the address of a particular control word in a horizontal control store, the control word requiring the movement of data from a first specified register (e.g., general register GR1) to a second specified register (e.g., general register GR2). In contrast the two-level microcode system of the invention might, for example, specify, with a vertical microinstruction, a horizontal instruction which requires the movement of data from an unspecified location to an unspecified location. Such microinstruction would be common to a large number of data movement instructions. The vertical microinstruction could then also contain in its modifier fields the specific source and destination locations for such data movement and thereby modify the basic horizontal microinstruction so as to identify such locations therein.

Further, the two-level microcode system of the invention can be arranged so that the vertical microinstructions can be fetched from control stores which are located directly on the microprocessor chip or, alternatively, from external microcontrol sources. The horizontal microcontrol store can also be located directly on the microprocessor chip.

The power of each horizontal microinstruction is effectively multiplied by the modifications of such microinstructions which can be achieved by the vertical microinstructions, such technique being sometimes designated herein as a two-level "micro-modification" technique. Since each horizontal microinstruction can be modified by a large number of vertical microinstructions to represent thereby a large number of overall unique microinstructions, a relatively small number of horizontal microinstructions can be used to provide a general, but efficient set of basic control operations, sometimes referred to as "control primitives".

DESCRIPTION OF THE INVENTION

The various aspects of the invention can be described more fully with the help of the accompanying drawings wherein:

FIGS. 5-7 show block diagrams of exemplary logic useful in controlling system bus protocol for the system of FIG. 1;

Figures 1, 14:
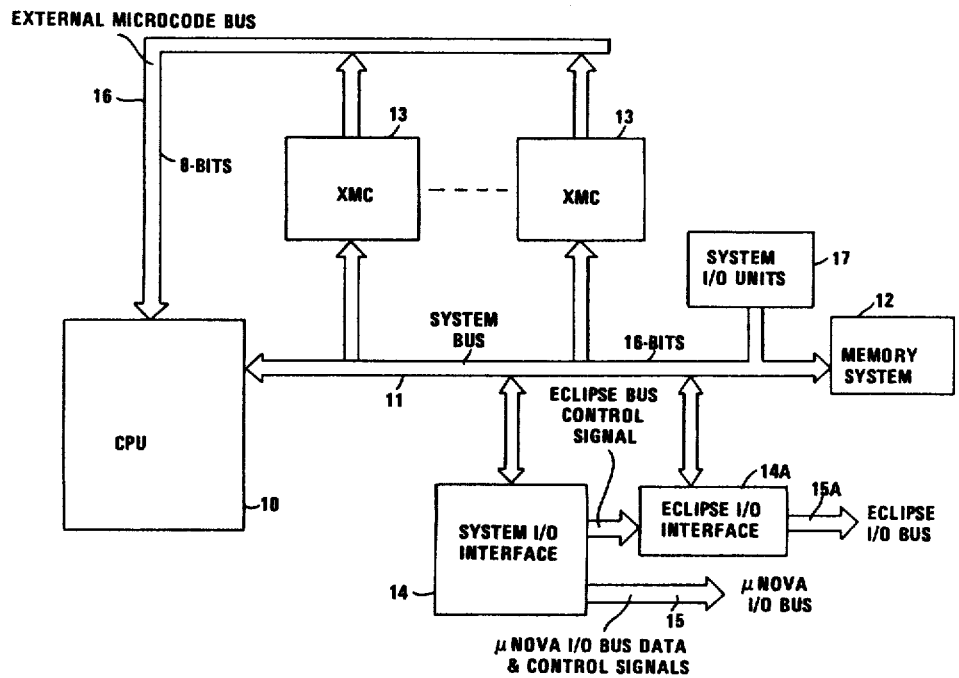
FIG. 1 shows a broad block diagram of an overall system in accordance with the invention.
Figure 8:
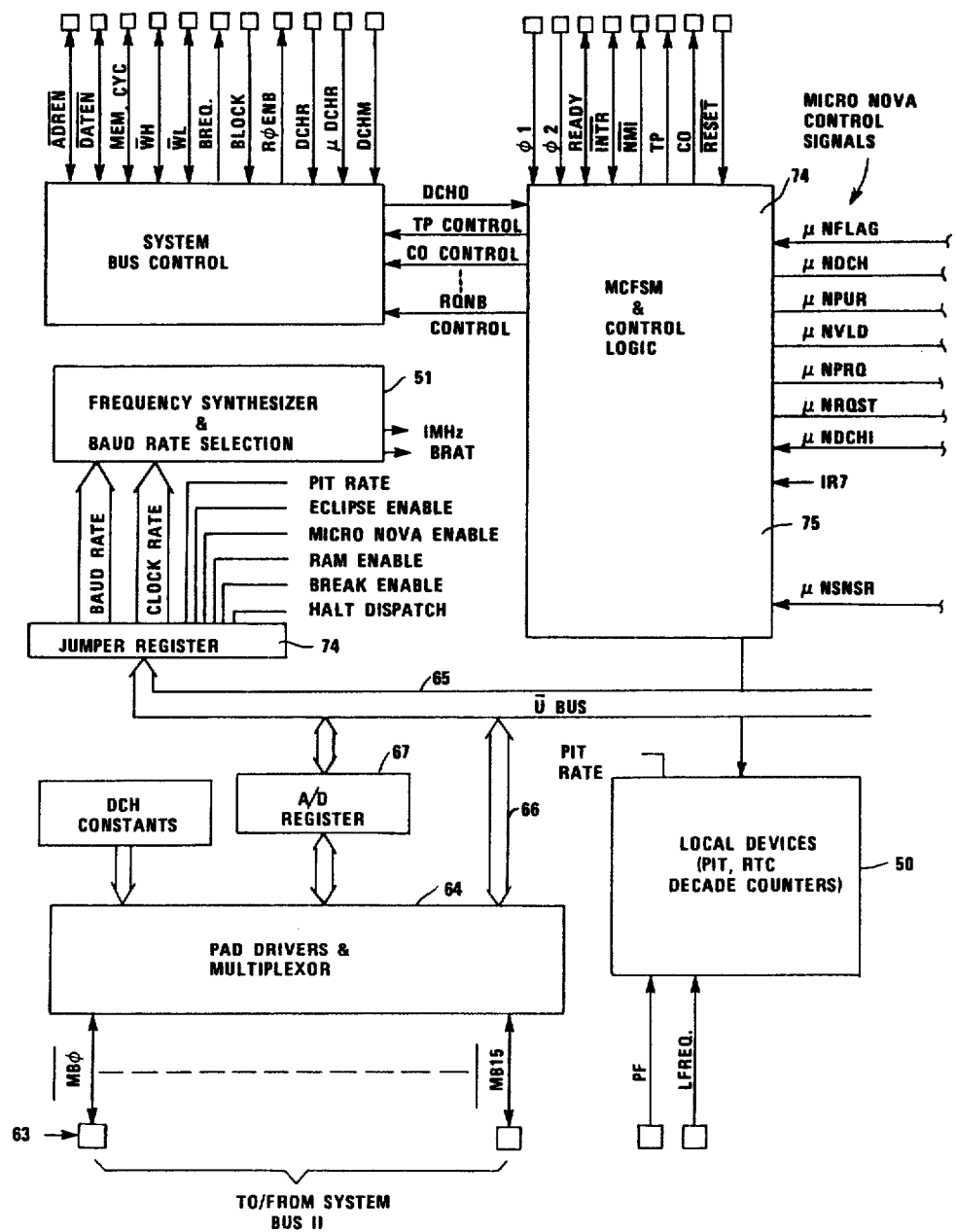
Figure 8A:
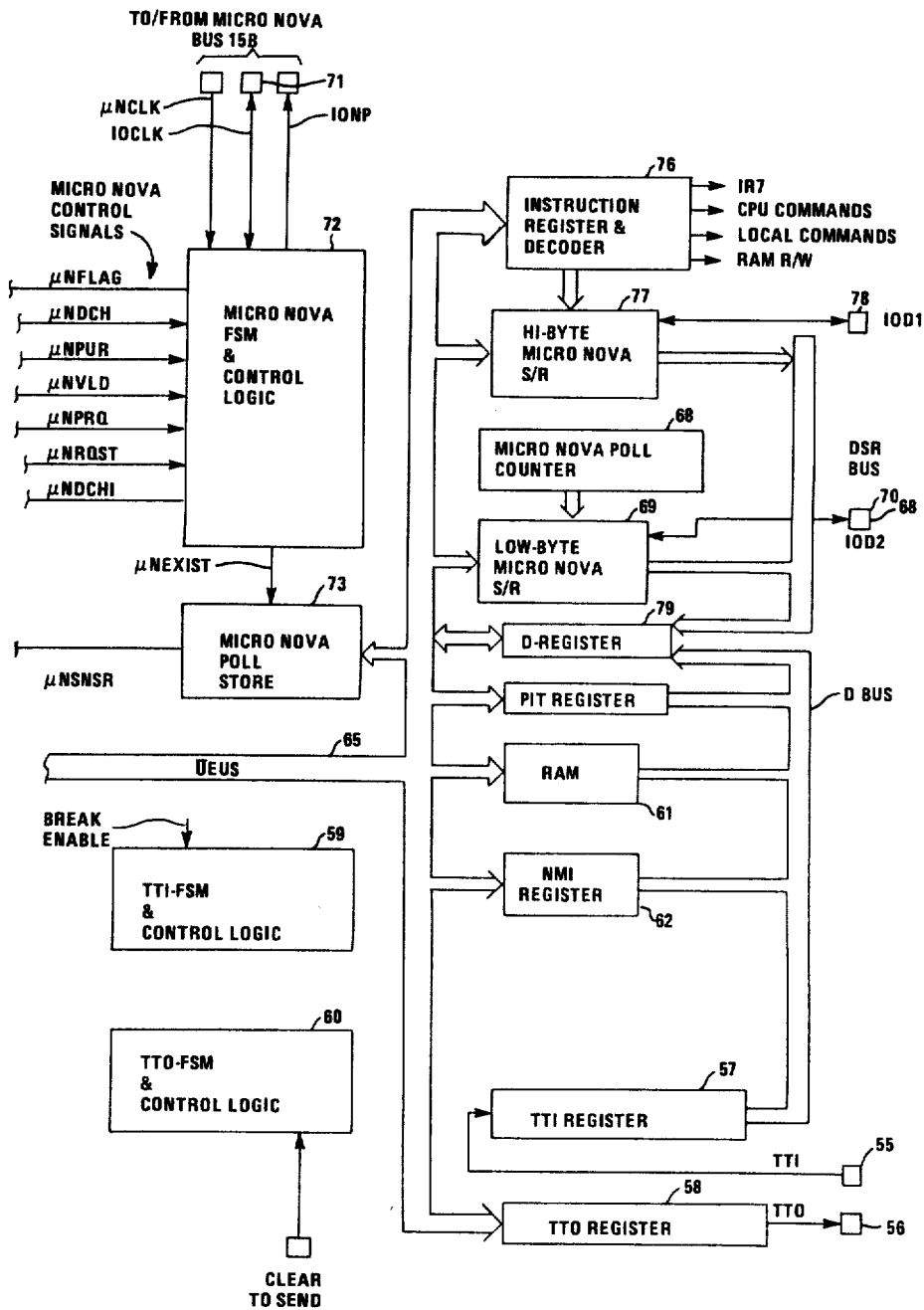
Figure 8B:
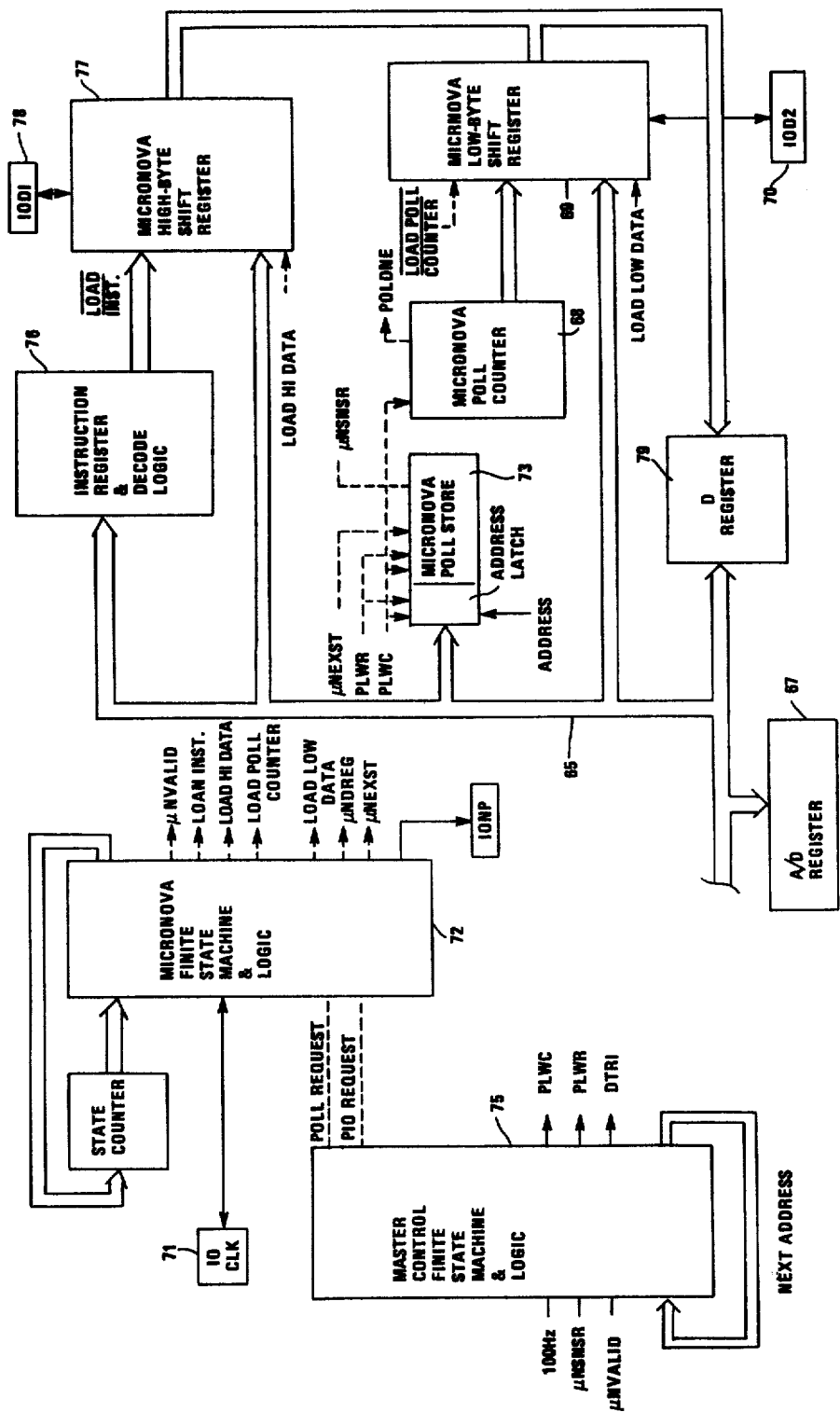
Figure 10:
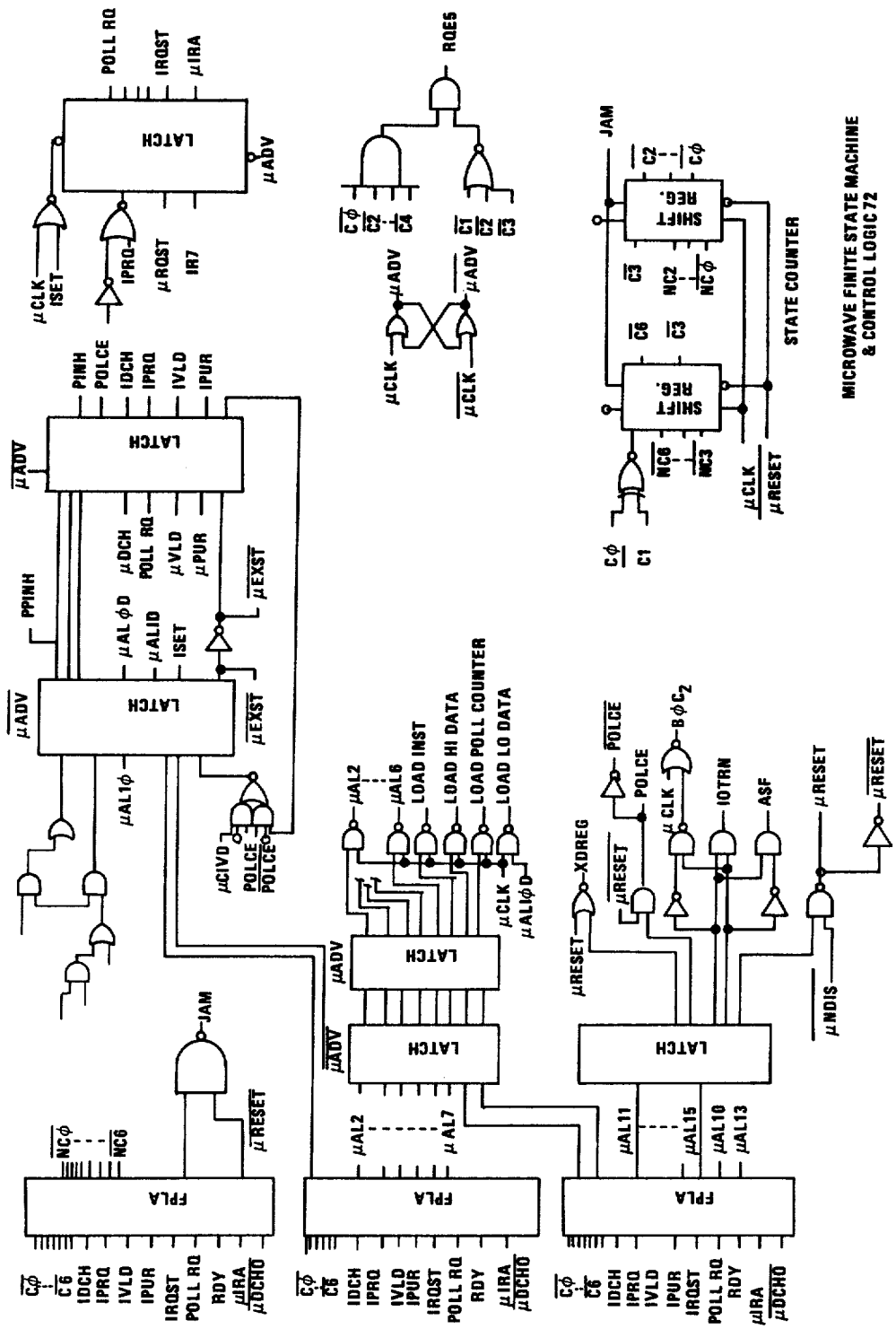
Figure 11:
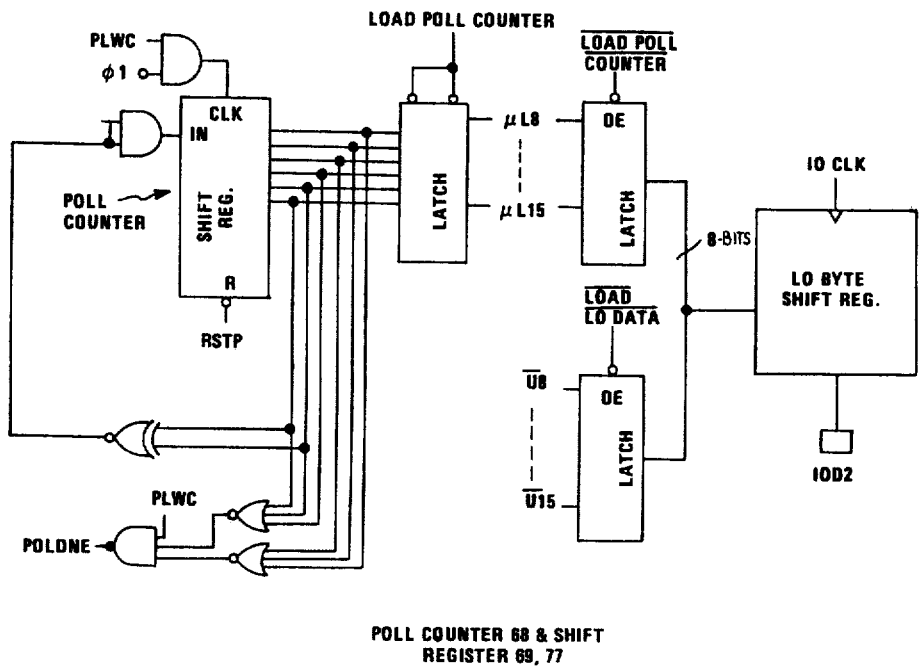
Figure 12:
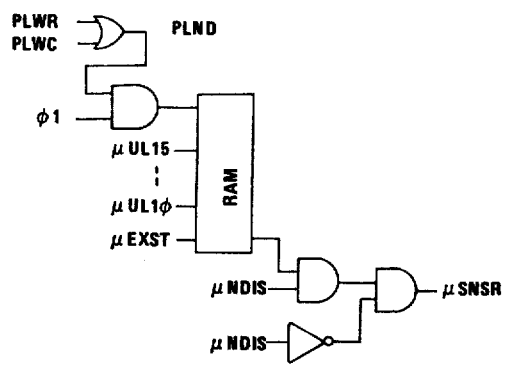
Figure 13:
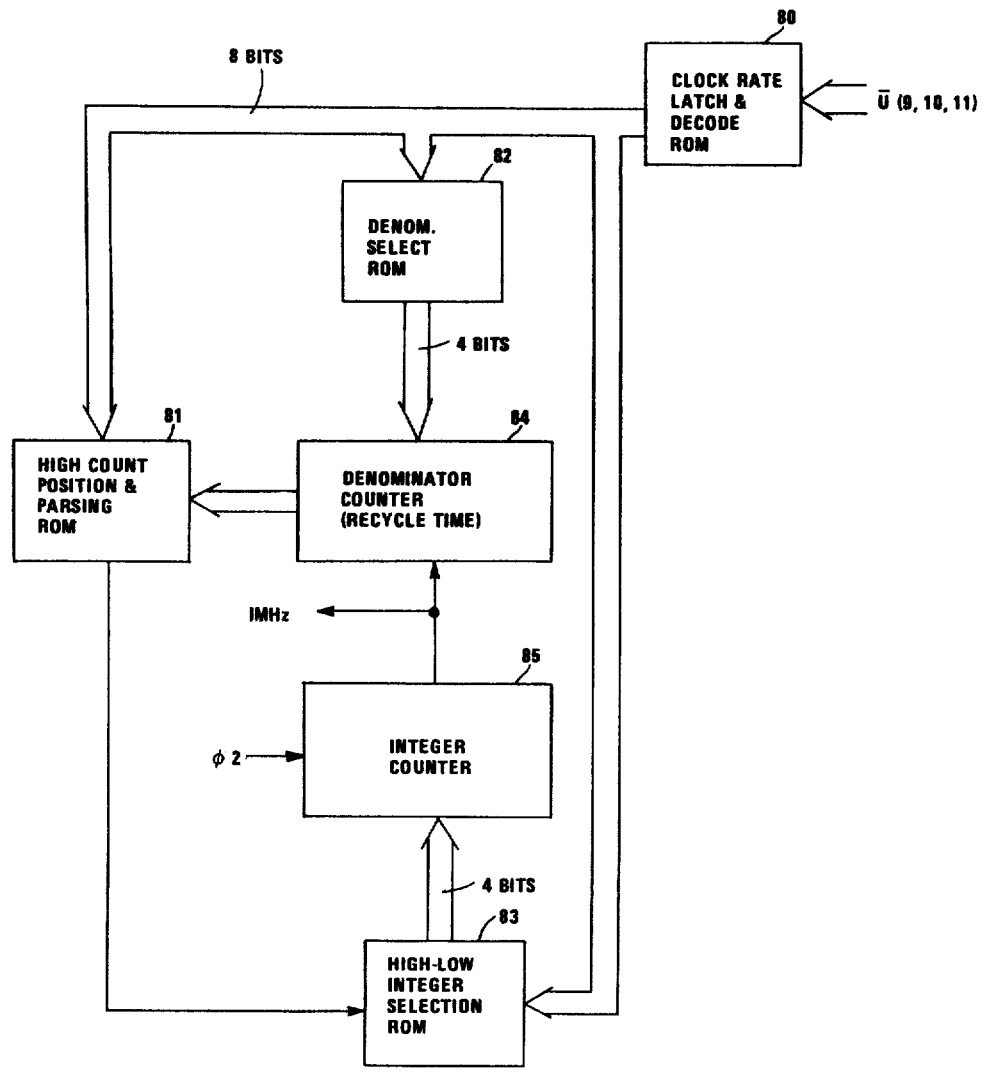
Figure 15:
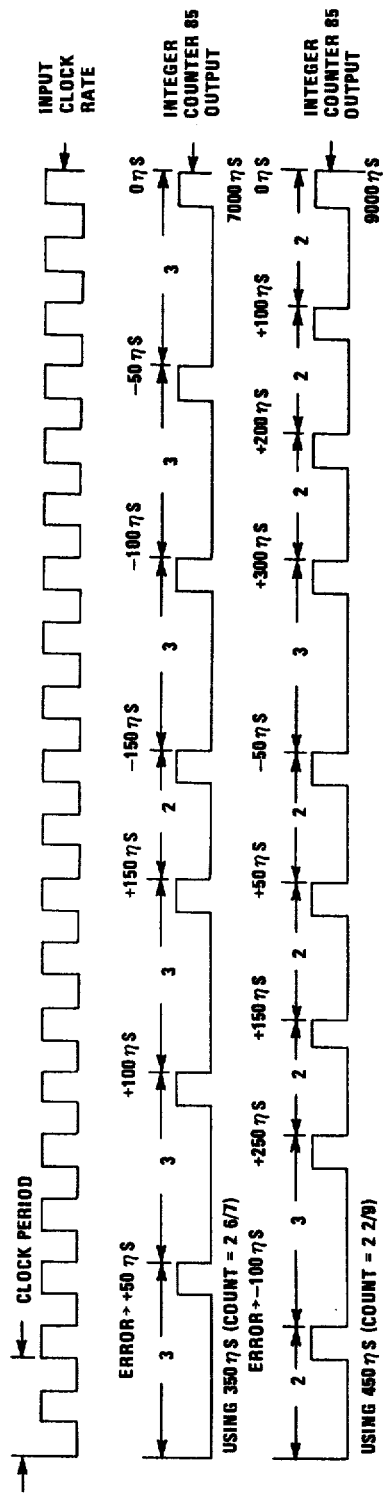

FIGS. 8 and 8A, when taken together, show a block diagram of the system I/O interface unit of FIG. 1;

FIG. 8B shows a more specific block diagram of a portion of the system I/O interface unit of FIGS. 8 and 8A;

FIG. 9 shows a more specific logic diagram of the master control finite state machine and control logic of FIGS. 8 and 8B;

FIG. 10 shows a more specific logic diagram of the microNOVA(R) finite state machine and control logic of FIGS. 8A and 8B;

FIGS. 11 and 12 show more specific logic diagrams of the microNOVA polling logic of FIGS. 8, 8A and 8B;

FIG. 13 shows a more specific block diagram of the frequency synthesizer unit of FIG. 8;

FIG. 14 shows a chart which depicts the parsing algorithm used for the operation of the frequency synthesizer of FIG. 13; and FIG. 15 shows an exemplary timing diagram of the frequency synthesizer output signal as generated from either of two exemplary input signals thereto.

An overall system using the techniques of the invention is shown in FIG. 1 wherein a microprocessor chip 10 (identified as a central processor unit or CPU in the figure) is interconnected via an appropriate system bus 11 with a memory system 12, one or more system I/O units 17, one or more external microcontroller chips 13 (identified as "XMC" chips) and a system input/output interface unit 14 (identified as the system I/O interface) and a further interface unit 14A (identified as ECLIPSE ® I/O interface) which latter units interface with appropriate buses 15 and 15A for external input/output devices. For example, in a particular embodiment the system is designed to operate with peripheral (I/O) units of the microNOVA ® type as used with microNOVA ® computer systems as made and sold by Data General Corporation of Westboro, Massachusetts and with peripheral (I/O) units of the ECIPSE ® type as used with ECLIPSE ® computer systems and made sold by Data General Corporation at least on or after early 1978.

In a particular embodiment thereof the system bus 11 is a 16-bit parallel system bus, as shown, while microcode bits from the external microcontroller chips 13 are transmitted to the CPU in a time-multiplexed fashion via a suitable dedicated eight-bit microcode bus 16.

Figure 2:
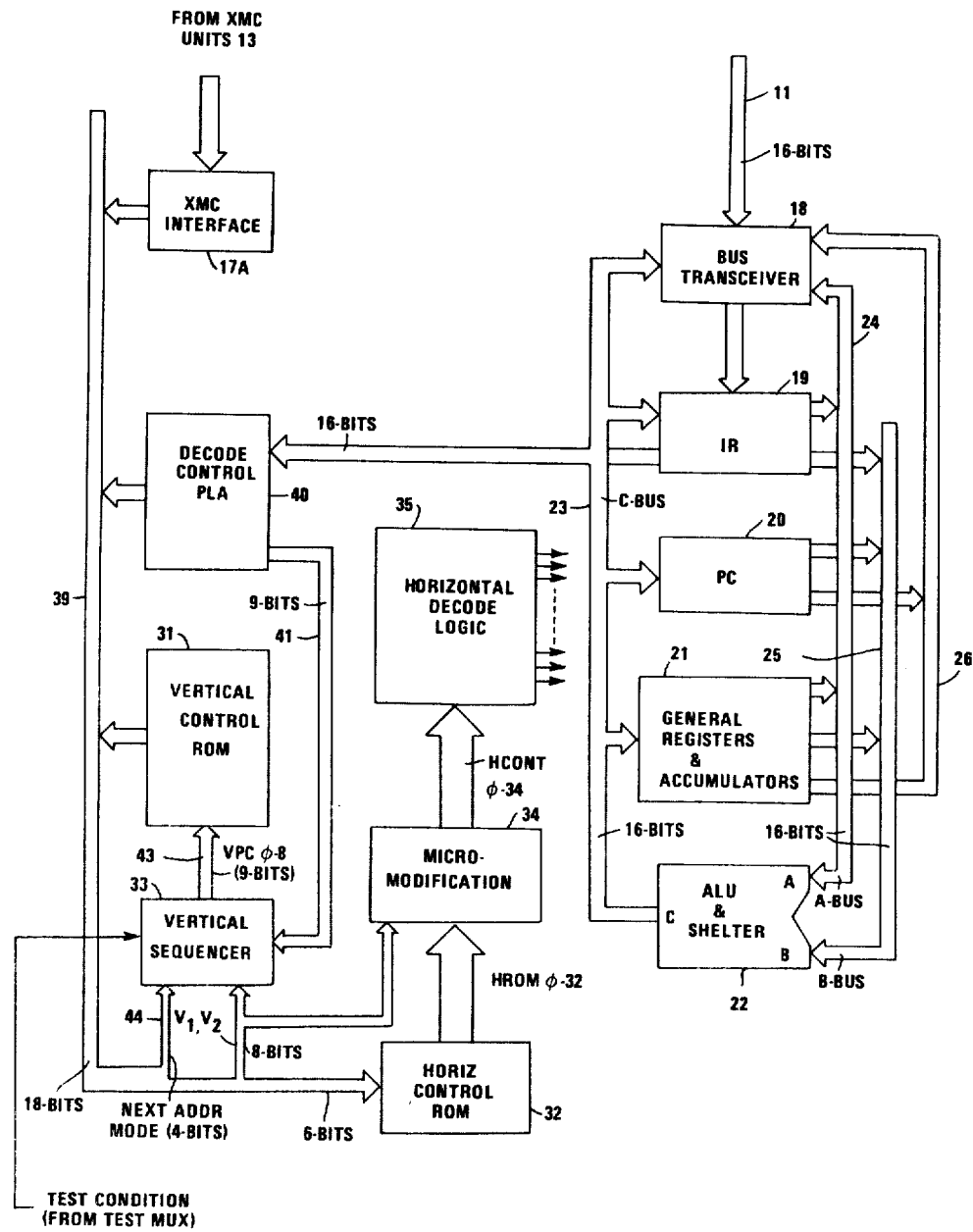
FIG. 2 shows a block diagram of an exemplary central processor unit (CPU) of the system of FIG. 1.

FIG. 2 depicts a more detailed block diagram of CPU 10, the eight-bit external microcode bus 16 supplying its microcode bits to an appropriate external microcontroller chip (XMC) interface unit 17A and the system bus 11 being connected to a suitable bus transceiver unit 18 capable of accepting or of supplying appropriate data for transmission to and from the CPU.

The CPU utilizes macro-instruction logic which includes macro-instruction register (IR) 19 and program counter (PC) register 20, together with a suitable register file 21, comprising appropriate general registers and accumulators, and a suitable arithmetic logic unit (ALU) and shifter unit 22 having "A" and "B" inputs and a "C" output, such registers, accumulators, ALU and shifter components being capable of implementation using suitable configurations well known to the art.

A plurality of four internal buses 23, 24, 25 and 26 provides for appropriate internal data paths among such units, as shown in FIG. 2. The C-output of the ALU and shifter logic 22 is supplied to the other units as well as to the system bus via bus transceiver on internal C-bus 23. The A and B inputs to the ALU and shifter logic 22 communicate with the other units via internal A-bus 24 and B-bus 25, respectively. Internal bus 26 provides a direct path from the registers and accumulators to the system bus 11 via bus transceiver 18. The use of such multiple internal data paths permits several concurrent operations to occur within a single microcycle, which in the particular embodiment discussed here is 400 nanoseconds. In accordance therewith, 16-bit register-to-register operations are performed in one microcycle (sometimes referred to as a T-period) and memory-to-register transfers are performed in two microcycles (two T-periods).

The two-level microcontrol stores are depicted as vertical control read-only-memory (ROM) 31 and horizontal control ROM 32. In a particular embodiment of the invention, the first level, or vertical, control ROM 31, provides an 18-bit vertical microinstruction, 6 of such bits being used to select one of a plurality of second level, or horizontal, microinstructions at horizontal microcontrol ROM 32, there being 64 of such instructions stored therein in the particular embodiment shown here. Horizontal control ROM 32 provides horizontal microinstructions having 33 bits, in a particular embodiment, the horizontal control ROM, for example, having a 64×33 bit configuration. In the embodiment described, eight bits from the vertical control store 31 are used to provide two 4-bit modifier fields which can be used to modify the horizontal microinstruction which has been selected from the horizontal microcontrol ROM as discussed below. The remaining four bits of each vertical microinstruction are used to control the sequencing of the vertical microinstructions, i.e., to specify the next address mode from vertical control ROM 31 via appropriate vertical sequencing logic 33. The modification of specified fields of the selected horizontal microinstruction by the two modifier fields of the vertical microinstruction is accomplished via appropriate micro-modification logic 34 which thereupon supplies a 35-bit microinstruction word which is suitably decoded by horizontal decode logic 35 to provide the necessary control signals and sequencing signals required for performing the function of the selected microinstruction.

Vertical microinstructions can be fetched either from the CPU-resident vertical control ROM 31 or from an external microcontroller chip 13 (see FIG. 1) via external microcontroller chip interface unit 17A, while horizontal microinstructions are fetched from the CPU-resident horizontal control ROM 32. External microcode can be obtained from an XMC unit 13 by the use of suitable time-multiplexing techniques, the external vertical microcode comprising 16 bits supplied in time-multiplexed 8-bit microcode bus 16.

The sequence of microinstructions required to be decoded by horizontal decode logic unit 35 is begun by a suitable decoding of a macroinstruction from instruction register 19 by a decode control programmed logic array (PLA) unit 40. Decoding of such macroinstruction by the decode control PLA unit 40 provides an initial vertical microinstruction on internal bus 39, as well as supplying on internal bus 41 the address of the next microinstruction which is to be fetched from the vertical control ROM 31. The sequencing of vertical control ROM 31 is appropriately controlled by the 9-bit sequence control signal supplied from vertical sequencer logic 33 via internal bus 43. Once the decode control PLA unit 40 supplies the initial microinstruction and the address for the next microinstruction from vertical control ROM 31, the sequencing of subsequent vertical microinstructions from ROM 31 is determined by the sequencing bits supplied to vertical sequencer unit 33 at internal 4-bit bus 44. If the microinstruction from vertical control ROM 31 requires a branch, or jump, to another vertical microinstruction rather than the selection of a horizontal microinstruction, the modifier bits are used to specify the branching operation and the 6-bits normally used to select a horizontal microinstruction comprise a "no-operation" (NOOP) code which inhibits the micro-modification unit 34 from using the 8-bit modifier fields for modification of a horizontal microinstruction.

Thus, in the micro-modification process, two 4-bit fields, for example, of the vertical microinstruction can be substituted for two or more 4-bit fields of the selected horizontal microinstruction. The technique of substituting vertical modifier fields into selected horizontal fields effectively multiplies the power of each horizontal microinstruction so that the overall orthogonal, two-level microcontrol store approach described provides a general, yet bit-efficient, set of basic horizontal microinstruction operations, sometimes referred to as control primitives having powerful capabilities for expanding the number of microinstruction in the microinstruction set of the overall system.

It is helpful in understanding the micro-modification process to consider a complete horizontal microinstruction set stored in horizontal control ROM 32 as set forth in Appendix A.

In a particular embodiment, for example, the horizontal microinstructions each include the following nine fields as shown below:

| 4 | 4 | 4 | 4 | 4 | 3 | 2 | 4 | 4 |
|---|---|---|---|---|---|---|---|---|
| A-BUS | B-BUS | ALU | SHF | DEST | ADR | MEM | TEST | RAND |

The A-BUS field defines the source of the data for the A-input of ALU/shifter 22 on A-bus 24 while the B-BUS field defines the source of data for the B-input of the ALU/shifter 22 on B-BUS 25. The ALU field defines the operational function to be performed by the ALU while the SHF field defines the shifter function. The DEST field defines the destination for the data which is placed on C-BUS 23 from the ALU/shifter 21. The ADR field defines the source of the memory address while the MEM field provides control for the interconnection between the system bus 11 and the C-BUS 23. The TEST field is used to identify various system conditions to be tested, while the RAND (random) field provides for other special control functions. Appendix A sets forth in more detail the meanings of each of the above fields.

The vertical microcontrol ROM 31 is a ROM configuration which in a particular embodiment, for example, includes 288 microinstruction words, each 18 bits wide, one horizontal microinstruction being executed for each vertical microinstruction that is executed. Sequences of vertical microinstructions interpret macro-instructions (i.e. machine instructions as decoded by decode control PLA unit 40).

The vertical microinstructions each involve the following four fields as shown below:

| 6 | 4 | 4 | 4 |
|---|---|---|---|
| ADRH | V1 | V2 | NAM |

The 6-bit ADRH field defines the address of the horizontal microinstruction which is to be selected in the horizontal main control store 32. The 4-bit V1 field defines the first modifier (sometimes referred to as modifier 1) for the selected horizontal microinstruction while the 4-bit V2 field (modifier 2) defines the second modifier for the selected horizontal microinstruction. A 4-bit NAM field which is supplied to the vertical sequencer logic 33 identifies the next address mode for selecting the next sequential vertical microinstruction, such mode bits being used to generate a new vertical program counter 9-bit address. Appendix B sets forth in more detail the meaning of each of the above fields.

As can be seen in Appendix A, in many of the horizontal microinstructions certain fields are specified as requiring one of the vertical microinstruction modifier fields, identified as either the V1 vertical modifier field or the V2 vertical modifier field. The remaining fields of each of the horizontal microinstructions are fixedly specified as shown. In a particular horizontal microinstruction, for example, identified as a "write memory" (WMEM) microinstruction, all fields thereof are specified except the ABUS field, which requires the use of the V1 vertical modifier field, and the ADR field, which requires the use of the V2 vertical modifier field, the V1 and V2 modifier fields being capable of identifying one of a plurality of sources of the data to be written (V1) and one or more addresses at which said sourced data is to be written (V2). Thus the basic and general write memory (WM) microinstruction can, with modification by the modifier fields, be used to generate a large number of specific "write" microinstructions with regard to a large combination of data sources and address destinations. In the particular embodiment discussed the use of two modifier fields permits a large number of microinstructions to be generated from only 64 basic horizontal microinstructions.

The decode control PLA unit 40 has a configuration which contains microinstructions each having 24 bits. Such unit is addressed with a 16-bit address from the instruction register 19 and provides the initial vertical microinstruction decoded from the macro-instruction and a 9-bit pointer to the next vertical microinstruction in the vertical control ROM 31 when a sequence of more than one microinstruction is required, as well as a flag which may invoke a subsequent macro-instruction for decoding where only a single microinstruction is required, as discussed below. There are as many entries in the decode control PLA unit 40 as there are macro-instructions implemented by the system of the invention.

The five fields of a starting microinstruction of decode control PLA unit 40 are shown below:

```
  6    4   4   9   1
[ADRH|V1|V2|ADRV|D]
```

The 6-bit ADRH field is the same as that described above with reference to the vertical microcontrol ROM 31, the 4-bit V1 field and the 4-bit V2 field also being the same as those described above with reference to the vertical microcontrol ROM. In addition, the decode control PLA unit supplies a nine-bit ADRV field which is the address in the vertical control ROM 31 of the second microinstruction of the microinstruction sequence required for the decoded macro-instruction. A single bit (the D field) indicates that the single microinstruction provided by the decode control PLA suffices to interpret the macro-instruction. In this case the ADRV field is ignored. A more detailed summary of the five fields of a starting microinstruction is set forth in Appendix C.

The vertical and horizontal control ROMs and the decode control PLA unit are conventional logic units well known to the art and need not be shown in greater detail. Logic for the vertical sequencer unit 33 and micromodification unit 34 are shown in FIGS. 3 and 4, respectively.

Figure 3:
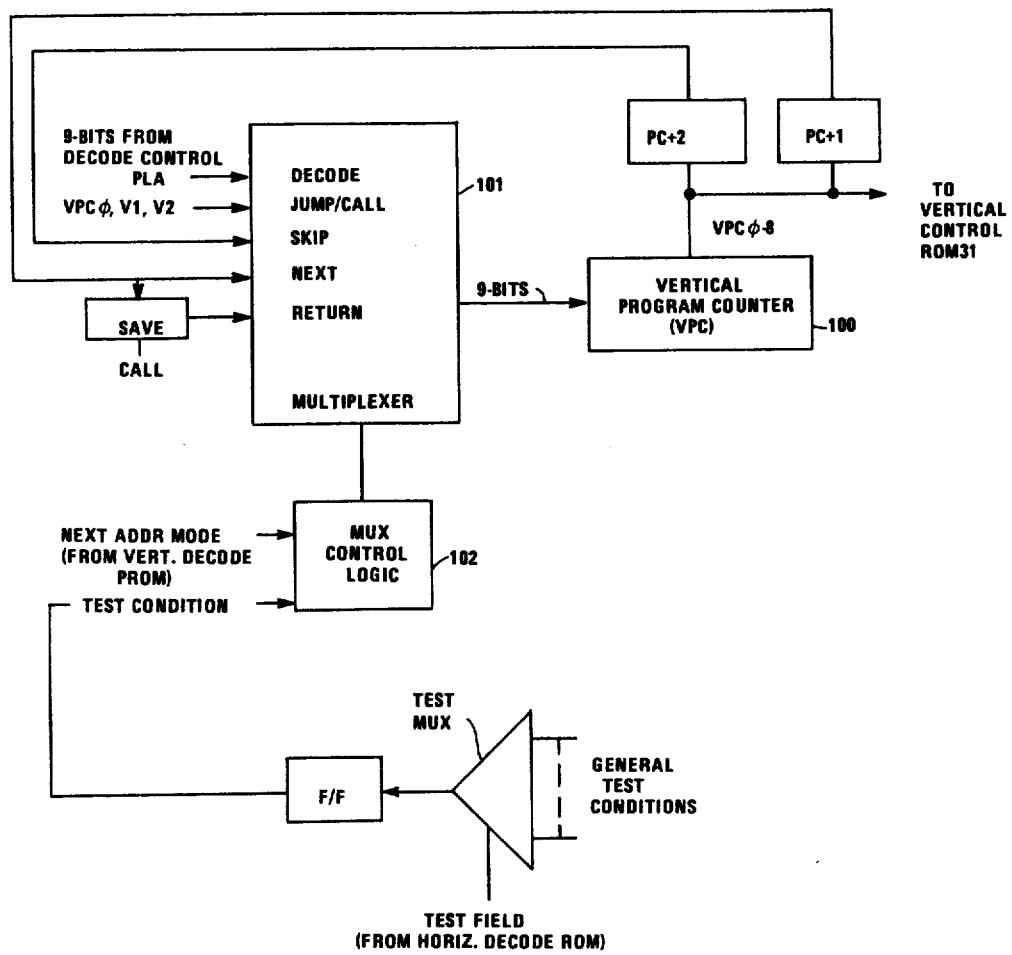
FIG. 3 shows a more specific block diagram of the vertical sequence unit of the CPU of FIG. 2.

As can be seen in FIG. 3, for example, the vertical sequencer in a particular embodiment can comprise a vertical program counter unit 100 and a multiplexer unit 101 which selects any one of five input signals to provide (1) for the decoding of the 9-bit output from decode control PLA unit 40, (2) for a jump (branch) or a call operation, identified by the zero-bit (VPC∅) of the program counter and the vertical modifier fields V1 and V2, (3) for a SKIP operation, i.e., a skip of the next program counter (PC+1) output to the next subsequent program counter output (PC+2), (4) the next program counter (PC+1) output, or a RETURN operation wherein the next program counter output (PC+1) is saved (as when an interrupt operation occurs) and then, following the interrupt routine, the vertical sequencer returns to the (PC+1) output.

The multiplexer operation is controlled by switching control logic 102 which provides for the next address mode of operation (wherein one of the above five operations is selected) when the test conditions required are present.

Figure 4:
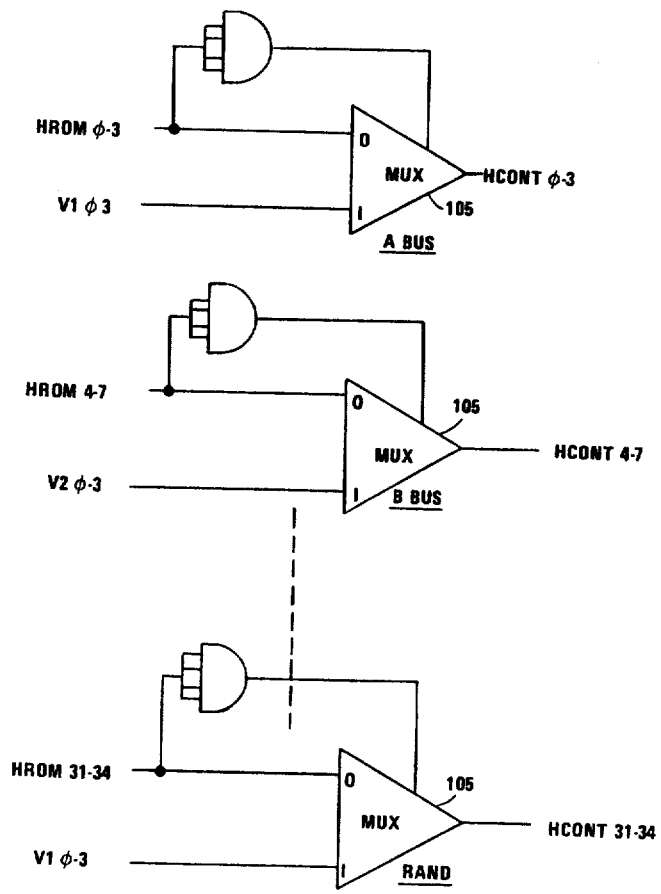
FIG. 4 shows a more specific block diagram of the micromodification unit of the CPU of FIG. 2.

FIG. 4 shows the micromodification unit 34 which comprises a plurality of 2, or 3, input multiplexers 105 each of which includes either a 4-bit horizontal input (for horizontal fields ABU, BBUS, ALU, SHF, DEST, TEST and RAND), a 3-bit horizontal input (for horizontal ADR field) or a 2-bit horizontal input (for horizontal MEM field) and either a V1 input (horizontal fields ABUS, ALU, RAND), a V2 input (horizontal fields BBUS, SHF, ADR, MEM and TEST) or both V1 and V2 fields (horizontal DEST field), as shown in Appendix A. The 4-bit horizontal inputs (HROM inputs) control the selection of the multiplexer input as either from the HROM bits or the V1 or V2 bits for supply to the horizontal decode logic 35.

The above discussed embodiment utilizes the particular fields specified for the horizontal microinstructions and set forth in Appendix D. In most cases, as can be seen, the horizontal fields which use the vertical modifier fields are those which specify source and destination locations. For example, for an INCH (increment) microinstruction, the A-BUS field is modified by the V1 vertical modifier field, the data at the location specified by V1 to be incremented being placed on the A-BUS, and the DEST field is modified by the V2 vertical modifier field, the incremented data then being placed in the location specified by V2.

The memory field (MEM) in the particular embodiment described bears special scrutiny. Up to 16 memory operations can be defined by using a 4-bit MEM field. However, as is noted in Appendix D only four operations are specified, ie., NOOP (no operation), RM (read memory), WM (write memory), and a V2 field. In this case the V2 field must be used to specify memory operations other than RM and WM. Thus, as can be seen in specific horizontal microinstruction micro-order encodings of Appendix E, the V2 modifier can specify the other memory operations (i.e., WHM, RMOD, WLM, RHYP, etc.). Thus, the MEM field need only use 2 bits (rather than 4 bits) with a vertical modifier used to specify all operations other than an RM and a WM. Thus, the horizontal control ROM 32 needs to provide only 33 bits, as shown in FIG. 2. However, as seen in Appendix E, and as shown in FIG. 4, 35 bits can be supplied to the micro-modification unit 34, two of the MEM bits 23–26 having no operating significance.

In each case where the memory operation is defined by the V2 modifier, the V2 modifier cannot be used to specify any other field and only the V1 modifier is free to modify one or more other fields, as appropriate. However, for both RM and WM operations both V1 and V2 modifiers are so available. Since most memory operations are RM or WM operations (where both V1 and V2 modifications are available), the modifier limitation placed on the other (not RM or WM) memory operations is not severe inasmuch as such latter operations are not often used. However, the overall flexibility of the MEM field operations is considerably increased since only four microinstructions are needed to specify memory operation horizontals. The use of the V2 modifier field increases the range of micro-order (control states) for memory operations to 15 additional micro-orders, as shown in Appendix E.

A similar arrangement may be used for other horizontal microinstruction fields, if desired, and the overall horizontal control ROM can be used to specify relatively few microinstructions, the range of micro-orders thereof being considerably increased by defining additional control states by using a vertical modifier field. While the use of one of the two vertical modifiers for such purposes limits the ability to modify more than one other field, in many instances the need to modify more than one other field may not be critical. Obviously, if one increases the number of vertical modifier fields, flexibility increases in this regard at the cost of a larger vertical microinstruction word.

In the limit, it may be possible to use a single horizontal microinstruction with a single bit for each field thereof which bit in each case specifies whether a modifier is to be used for such field or whether a default operation is to occur. In such a system, the number of available vertical modifiers should be sufficient to permit modification of all fields which require it for each definable micro-order. The range of horizontal microinstruction micro-orders can thereby be considerably increased at the expense of the requirement for relatively large vertical microinstruction words having the desired number of modifier fields.

System Bus Protocol

Information transfer (i.e., addresses, data, instructions, etc.) to and from the CPU from system components other than the CPU, such as one or more memory units and one or more input/output (I/O) devices, takes place on the 16-bit system bus 11 either directly or via interface units 14 and 17. An effective system bus protocol must be utilized in order to provide for the correct transfer of such information. In this connection, each bus transaction comprises two segments, one of which can be identified as a "specifier" segment and the other of which can be identified as a "data" segment.

The timing of the system operation is synchronized by two externally generated clocks, identifiable as phase-1 ($\phi$-1) and phase-2 ($\phi$-2) clocks. The clocks divide a microcycle time period (sometimes referred to as a "T-period") into a $\phi$-1 portion and $\phi$-2 portion.

During the specifier segment the bus is used to describe the type of bus cycle operation which is occurring (e.g., a memory reference operation or an I/O operation) and information describing the target of the transaction (e.g., an address for a memory reference operation). The specifier segment always occurs during the first $\phi$-1 portion of a bus transaction and cannot be extended. During the data segment the bus is used to transfer data as, for example, to or from the addresses or I/O devices specified in the specifier segment. The data segment begins in the first $\phi$-2 portion of a bus transaction and may be extended by an integral number of additional microcycles (each having $\phi$-1 and $\phi$-2 portions). The $\phi$-1 and $\phi$-2 portions of the T-period may generally be separated by an essentially fixed time gap (e.g., 15 nanoseconds) and, at any rate, must be set up so as to provide no overlapping of the phases.

In operation, a particular system component may be transferring data on the system bus during the data segment of its bus transaction while another component waits to transfer an address during the $\phi$-1 portion of the specifier segment of the next bus transaction. In time-multiplexed systems of the type described here, frequent bus "turn-around" operations of this nature give rise to problems. Because of delays in various logic components used in the operation of the system, the transfer of data during the data segment of one bus transaction may not be fully completed by the start of the $\phi$-1 portion of the specifier segment of the next bus transaction. Accordingly, the second component may attempt to place its address on the system bus before the data transfer for the previous component has been completed.

Such a condition will produce a relatively high instantaneous surge of current which will tend to have an adverse effect on the system. For example, if system components are formed as TTL circuitry, the current surge will tend to cause undesirable noise effects, i.e., electromagnetic interference, to occur throughout the system as well as tending to provide a long-term adverse impact on the TTL components themselves. Further, if the CPU is formed as an integrated circuit chip, for example, by MOS techniques, such a current surge will also adversely impact upon at least the long term, and possibly the short term, reliability of the MOS chip. Therefore, it is necessary to devise an appropriate technique for avoiding any overlapping of the system component bus driver operations which may result from the action of two different components at a bus turnaround operation in attempting to access the bus simultaneously (a "bus fighting" condition).

One previous solution to such problems has been to utilize a "dead" cycle (i.e., a non-operating cycle) at a bus turnaround operation, e.g., between the completion of each data transfer operation and the start of the next operating cycle, such as an address transfer operation, or vice-versa. During such dead cycle no information can be driven on to the bus and the bus in effect is idle. However, the presence of an extra dead cycle under such conditions either will require a basic microcycle clock of much higher resolution or will cause the operation of the overall system to be slower than desired. Accordingly, the use of a dead cycle is generally an undesirable approach to the problem.

Another proposed solution to the problem is to widen the separation between the two time phases, $\phi$-1 and $\phi$-2, of the T-period. However, the use of a wider gap lengthens the overall T-period and, accordingly, slows the system down to an even greater extent.

In accordance with the system discussed here the bus access overlap problem is avoided by the suitable generation of an address enable signal (ADREN) and a data enable signal (DATEN). The assertion of an ADREN signal indicates that a valid address is present on the system bus, while the assertion of a DATEN signal indicates that data is present on the system bus. If a DATEN signal is asserted, the address drivers of all other units which are capable of placing an address on the system bus are inhibited from operation. In a similar manner all data drivers are inhibited so long as an ADREN signal is asserted.

The ADREN signal is generated by the system component which has requested the current bus cycle to be started and indicates that information describing the type of bus cycle operation which is occurring has been placed on the bus. The particular system as described herein, for example, can initiate one of four different types of bus cycle operations, namely, a program memory reference, a console memory reference, an I/O operation, or a local memory reference operation. When the ADREN signal is asserted the system identifies which of the above four operations is to occur by placing an appropriate 16-bit word on the bus together with an additional bit as described below.

Thus, for a program memory reference the 16-bit word comprises a 15-bit address in bit positions 1-15, while bit $\emptyset$ of the word is used in conjunction with an additional bit supplied at an additional pin, designated as the memory cycle (MEMCYC) pin, as follows:

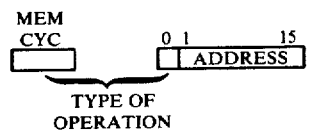

TYPE OF
OPERATION

In the system described, for example, the memory references may be to a standard NOVA/Eclipse logical address space to be used for program execution in NOVA and Eclipse computers made and sold by Data General Corporation, Westboro, Massachusetts, at least on or after early 1978 and later 1977, respectively, the operation of which is well known to the art. For such program memory reference, the states of the MEMCYC and bit ∅ pins identify the program memory reference operation, while the remaining 15 bits comprise the logical address for the memory reference. The combination of the MEMCYC and bit ∅ states are used to define each of the four system operations involved, as follows:

| MEMCYC | BIT ∅ | OPERATION |
| --- | --- | --- |
| 0 | 0 | I/O Operation |
| 0 | 1 | Local Memory Reference |
| 1 | 0 | Program Memory Reference |
| 1 | 1 | Console Memory Reference |

In the case of console memory operation which relates to address space used to store software for console operations, for example, the MEMCYC and bit ∅ pins define the console memory reference operation while again the remaining 15 bits define a console address. The local memory reference relates to address space which contains instructions for implementing inter-system communications (e.g., communications between the system CPU and other processors, etc.) and accordingly the system operation word includes a 15 bit local memory address. The I/O operation format which is placed on the system bus is discussed in more detail later.

When the bus type operation descriptor (i.e., the appropriate address or I/O function definition) is placed on the bus the ADREN signal is asserted. When whatever data involved is to be transferred on the bus, for example, during $\phi$-2 of the bus cycle, the ADREN signal is no longer asserted. The DATEN signal is asserted to indicate that a data transfer is taking place on the system bus so that all address drivers on the system are inhibited from operation, as mentioned above. The DATEN signal is supplied by the particular system component which is supplying the data which is being placed on the system bus.

The use of ADREN and DATEN signals for such control protects against the bus fighting condition which occurs during bus turnaround operations because of time delays in the system logic and, accordingly, improves the reliability of the system whether used with TTL logic or MOS chips.

Figure 6:
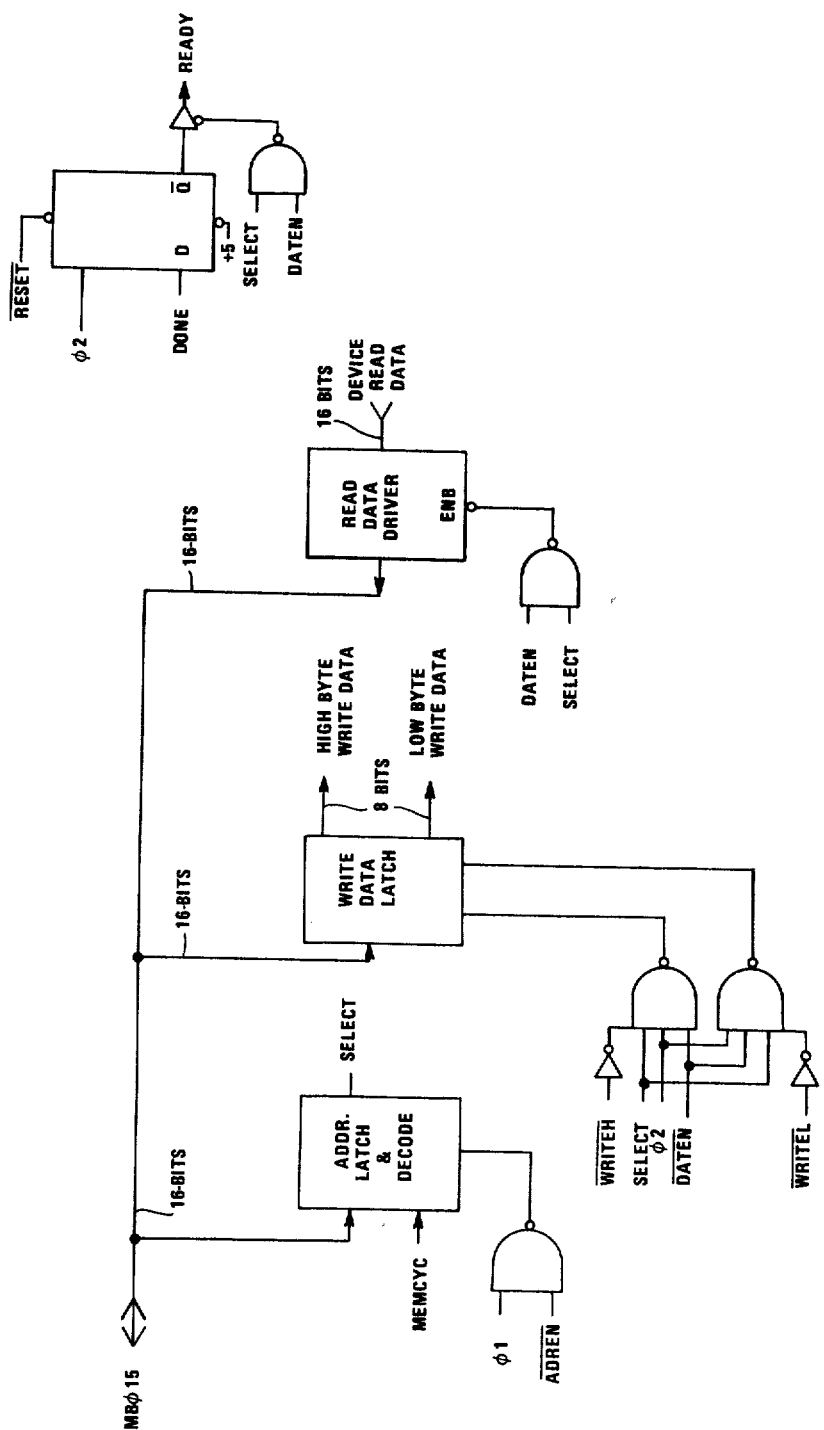

The system can be utilized with memories having different operating time cycles. If data at the address signified in $\phi$-1 is to be transferred between the CPU and a memory unit external to the CPU, for example, the data must be available for driving on to the bus during the subsequent $\phi$-2 so that the transfer can be completed therein. If the data is ready, the memory unit asserts a READY signal at the end of the $\phi$-2 portion of the current cycle during which the data has been driven on to the bus and the data transfer has been completed. If the data is not available and has not been driven on to the bus for transfer by the end of the $\phi$-2 portion of the current T-period, the READY signal is not asserted and the bus cycle operation is extended causing the DATEN signal to remain asserted for one, or more, T-periods, as necessary, until the data is available and ready for transfer. Logic for generating the READY SIGNAL, the ADREN signal and the DATEN signal is shown in FIGS. 5, and 6.

Further, if the system component which has control of the system bus for a data transfer operation does not intend to relinquish such control, such component must assert a bus locking signal (B/LOCK) in order to maintain control of the bus until the operation it is performing has been completed. For example, a system component may wish to read data, modify the data in some way, and return the modified data to the component for use or for storage, an operation sometimes referred to as a read-modify-write (RMW) operation. Accordingly, such component can not give up control of the bus until the data has been modified and returned to the component, an operation which may require one, or more, T-period cycles. In such situation the system component which is performing the RMW operation asserts a B/LOCK signal until the overall RMW operation has been completed. Such assertion prevents any other unit from obtaining control of the bus. An exemplary logic circuit for generating the B/LOCK signal is depicted in FIG. 7.

Any unit which is in communication with the system bus can be made master of the bus whenever a current bus cycle operation, if any, terminates, control of the bus being relinquished at the beginning of the next T-period, (i.e., so long as a READY signal has been asserted by any unit utilizing the current bus cycle and so long as no B/LOCK signal has been asserted by another unit). Thus, a unit which desires master bus control monitors the READY signal and the B/LOCK signal, requests control of the bus by asserting a bus request (BREQ) signal and is permitted to gain control of the bus under the above described conditions of the READY and B/LOCK signals. Such unit maintains control until it no longer asserts the BREQ signal, so long as a device having a higher bus priority does not also request control of the bus at the end of any bus cycle.

In this way bus control is handled by the unit which desires the control rather than by the CPU. In previous systems bus control is normally handled by the CPU which must entertain a bus request from an external unit and subsequently decide whether or not to provide a "bus grant" signal, or its equivalent. Such a decision-making process by the CPU requires a relatively long time due to the propagation delays of the signals required between the CPU and the various system components with which the CPU must communicate in order to make its decision. In accordance with the procedure used in the system of the invention, i.e., where the unit itself generates a BREQ signal and under the proper conditions thereupon receives control of the bus, bus control requests are handled in a much faster manner and bus control can be handed over to the requesting unit much sooner.

As mentioned above, each of the different types of bus operation require the utilization of the MEMCYC pin which, together with bit ∅ of the bus cycle description word (i.e., an address or I/O operation word), defines the type of operation which is to be performed. In accordance with the operation chart set forth above, I/O operations are defined when the MEMCYC and bit ∅ of the address word are both zero. For such operating condition the following word format for I/O operations is placed on the system bus:

| MEM CYC | 0 | 1 | 2 | | | 4 | 5 | 6 | 7 | 8 | 9 | 10 | | | | 15 |
|---|---|---|---|---|---|---|---|---|---|---|---|---|---|---|---|---|
| 0 | 0 | 0 | SYS. I/O AND DCH·FUNCTIONS | | | | I/O PORT | | DIR | S/C/P | | DEVICE CODE | | | | |

The above I/O instruction effectively represents a re-encoded version of the standard NOVA/Eclipse I/O instruction format received at the CPU, the re-encoded instruction being placed on the bus during the cycle description portion of the current bus cycle. The original microNOVA ®/ECLIPSE ® I/O instructions are re-encoded as above in order to facilitate the design of the interface logic between the CPU and the I/O devices.

As can be seen therein, bit Ø is utilized in conjunction with the MEMCYC pin to define the I/O operation. Bit 1 is a non-used bit which has been reserved for possible future use. Bits 2–4 are utilized to define the system, I/O and data channel (DCH) functions as follows:

| BIT 2 | BIT 3 | BIT 4 | FUNCTION |
|---|---|---|---|
| 0 | 0 | 0 | NOP |
| 0 | 0 | 1 | INTA |
| 0 | 1 | 0 | MASKO |
| 0 | 1 | 1 | IORST |
| 1 | 0 | 0 | DCHA |
| 1 | 0 | 1 | DCHI |
| 1 | 1 | 0 | DCHO |
| 1 | 1 | 1 | Reserved |

Bits 5 and 6 define the I/O port which is utilized as follows:

| BIT 5 | BIT 6 | PORT |
|---|---|---|
| 0 | 0 | Status |
| 0 | 1 | A |
| 1 | 0 | B |
| 1 | 1 | C |

Bit 7 defines the direction of the transfer as follows:

| BIT 7 | DIRECTION |
|---|---|
| 0 | OUT |
| 1 | IN |

Bits 8 and 9 define the control option which is being utilized, i.e., either a start, a clear, or a pulse operation in accordance with normal ECLIPSE ® operations as follows:

| BIT 8 | BIT 9 | FUNCTION |
|---|---|---|
| 0 | 0 | NONE |
| 0 | 1 | START |
| 1 | 0 | CLEAR |
| 1 | 1 | PULSE |

Bits 10–15 define the 6-bit device code which identifies a particular I/O device which is to be utilized during the I/O operation. The above operations are as defined, for example, with previously known ECLIPSE ® computers and, being known to those in the art, need not be defined in further detail.

The use of the above I/O instruction format requires less external logic for handling I/O instructions than was normally required for the handling of I/O instructions using the known previous ECLIPSE ® instruction format. The type of operation, i.e., a memory reference or a I/O operation, is appropriately flagged (by the MEMCYC and bit Ø states) and, if it is an I/O operation, the I/O instruction is sent in accordance with the above format in order to ease the interface operation.

In this connection one particular combination of bits in an I/O instruction is of some significance since it extends the capability of the I/O operation over that previously available to ECLIPSE ® systems. Thus, as can be seen, the I/O ports include not only the normal A, B and C ports utilized in ECLIPSE ® systems but also identifies an additional port capability defined as the "Status" port, the use of which is described below.

Thus, if the I/O instruction identifies a STATUS port in the port field (bits 5,6 are 0,0) and an IN direction in the direction field (bit 7 is 1), such instruction operates as a request to the identified device (identified by device code bits 10–15) to provide information as to its status. The device then returns data in the following format:

| 0 | 1 | 2 | 3 | | 15 |
|---|---|---|---|---|---|
| BUSY | DONE | POLL | RESERVED | | |

The device indicates its presence on the system bus by the state of the poll bit 2, and further indicates its "busy" or "done" state by bits 0 and 1, respectively. In addition the device has 13 reserved bits for use in providing further information.

Such format contrasts with the previous ECLIPSE ® instruction format which did not permit the inclusion of such status information (thereby requiring two extra wires for separately generated "busy" and "done" flags) and which was not adaptable for "polling" (i.e., obtaining an indication of the presence of a device on the system bus) as is helpful in the present system described herein.

Accordingly, the revised I/O instruction format, which is supplied to the system bus and which does not require the inclusion of accumulator bits (which are already identified for the CPU by the standard I/O instruction received thereat) provides for the further ability to transfer data not provided for by the standard microNOVA ® /ECLIPSE ® I/O instruction format.

System I/0 Interface Unit

As can be seen in FIG. 1, the system CPU is arranged to be capable of communicating with I/O devices on a plurality of different buses. For example, the CPU may communicate with I/O devices directly on the system bus 11, with I/O devices on bus 15A designated in a particular embodiment, for example, as the ECLIPSE ® I/O bus for ECLIPSE ® I/O devices, or on bus 15B designated in a particular embodiment, for example, as the MicroNOVA ® bus for microNOVA ® devices. In accordance with the system described herein, data can be transferred directly to and from the system I/O devices via the system bus 11, as described in more detail below, while data for ECLIPSE ® I/O devices are transferred to and from such devices via ECLIPSE ® bus 15A through a separate ECLIPSE ® I/O interface unit 45, the transfer thereof being controlled by control signals from the system I/O interface unit 14. Further, data for the microNOVA ® I/O devices are transferred to and from such devices on the microNOVA ® bus 15B through the system I/O interface unit.

A more detailed block diagram of the system I/O interface unit 14 is shown in FIGS. 8 and 8A. A further, even more detailed, block diagram of the microNOVA ® bus control logic for address/data transfers and for microNOVA ® polling operation (as discussed in more detail below) is shown in FIG. 8B. As can be seen therein, the system I/O interface unit comprises a plurality of local, or internal, devices and various control logic circuits, shown as block 50, the devices being of the type which are already known and used with respect to previously available systems. For example, the internal devices of the system I/O interface unit 14 may include devices of the type utilized in the Data General Corporation ECLIPSE ® computer systems, as shown and discussed with reference to the following publications:

ECLIPSE ® M/600 Principles of Operation No. 014-000092 (April 1978—First Printing January 1978)
ECLIPSE ® S/250 Programmer's Reference Manual No. 014-000611 (August 1978)
Interface Designer's Reference NOVA ® and ECLIPSE ® Line Computers No. 015-000031 (February 1978)
microNOVA ® Integrated Circuits Data Manual No. 014-000074 (November 1977)

The above publications are representative of publications available from Data General Corporation, Westboro, Massachusetts concerning NOVA ®, ECLIPSE ®, and microNOVA ® systems made and sold by Data General Corporation. Such publications contain information useful as background information in understanding not only the aforementioned internal devices but also various other aspects of the system being described herein.

Thus, such devices may include a "programmable interval timer" (PIT) unit which provides a programmable timing signal which produces clock signals at a counter clock rate at one of four selectable frequencies, for example. In a particular embodiment, for example, the programmable interval timer can be arranged to produce counter clock intervals at 1 MHz, 100 KHz, 10 KHz or 1 KHz from a constant input clock signal of 1 MHz through well-known frequency divider techniques. In the system I/O unit, such timer responds to a pseudo-constant 1 MHz signal which is derived from a frequency synthesizer unit 51, as discussed in more detail below.

The local devices may also include, for example, a "real time clock" (RTC) unit which generates timing pulses that are independent of the system clock rate. The real time clock can interrupt at any one of four selectable frequencies, for example, at the AC line frequency, or at 10 Hz, 100 Hz or 1000 Hz the latter three clocks all derived from the pseudo-constant 1 MHz signal through well-known frequency divider techniques.

The internal devices may also include a power monitor unit which detects any transition of a power monitor pulse which indicates that AC power has failed or that AC power has returned after a momentary power failure, or that a start up power condition exists.

The system I/O interface unit also includes appropriate input and output interface logic via which serial data can be asynchronously supplied (as from a teletype unit, for example), such inputs and outputs being supplied via TTI pin 55 and TTO pin 56, respectively, and from input and output registers 57 and 58, respectively, in a controlled manner in accordance with standard practice utilizing suitable finite state machine (FSM) and control logic 59 and 60. As in prior art devices utilizing asynchronous, serial data terminal inputs and outputs, the terminal unit may operate at selectable baud rates, the available baud rates being selected from a large number of such rates ranging in a particular case from 50 baud to 38400 baud, for example. For such purpose in this system the baud rate signals are derived from a pseudo-constant 614,400 Hz master baud rate signal, also obtained from the frequency synthesizer unit 51. The selected baud rates can be obtained therefrom through suitable baud rate selection logic in accordance with well-known techniques of prior art systems which utilize such asynchronous, serial data input and output operation.

The internal units and the terminal logic discussed above do not form a part of the inventive aspects of the system I/O interface unit 14 and need not be described in further detail.

For convenience, an appropriate random access memory (RAM) storage unit 61 may also be present on the system I/O interface unit for providing temporary storage space which may be used, for example, when performing console operations. Such storage unit is of a well-known RAM type which can be formed to provide storage space of an appropriate size for the desired console use. For example, a particular embodiment may be capable of storing a selected number of 16-bit words for such purpose. As such, the RAM unit 61 does not form a part of the inventive aspects of the system I/O interface unit 14 and need not be discussed in more detail. Further a non-maskable interrupt (NMI) register 62 for use as described in the aforesaid ECLIPSE ® and microNOVA ® documents may also be part of the system I/O interface unit 14 but does not form a part of the inventive aspects thereof and need not be described in further detail.

Addresses and data are supplied to and from the system bus 11 at the system I/O interface unit 14 in the form of 16-bit words ($\overline{MB}$ ∅-15) supplied at the physical address/data (PADS) pins 63. Suitable driver and multiplexer circuits 64 are utilized for such purpose, the address and data words which are being transferred to or from the system bus being supplied to internal $\overline{U}$ bus 65 for use in the system I/O interface unit 14 either directly via an internal bus 66 or indirectly via temporary address/data register 67 which may be used for temporary storage thereof before such addresses and data are supplied to the system I/O interface unit or to the system bus depending on the direction of transfer thereof.

The I/O buses which must be used to transfer addresses and data between the CPU and the I/O devices with which the CPU may desire communication differ depending on which type of I/O devices are involved (e.g., ECLIPSE ® devices which communicate via ECLIPSE ® bus 15A, microNOVA ® devices which communicate via microNOVA ® bus 15B and all other devices which communicate via system bus 11). The system I/O interface unit 14 must decide which I/O device is involved and, hence, which I/O bus is to be used for the transfer of such data so that the interface unit control can control such transfer to and from the CPU. In accordance with the system of the invention disclosed in FIGS. 8 and 8A, and the more detailed block diagram of FIG. 8B, the system I/O interface unit 14 contains logic circuitry for identifying all of the devices which are on a selected one of the two buses which it controls, namely, buses 15A or 15B. Such identification can be achieved by appropriately "polling" the selected one of such buses and storing suitable information as to which devices are on the selected bus.

In accordance with a specific embodiment of the invention which utilizes either a microNOVA ® I/O bus 15B or an ECLIPSE ® I/O bus 15A, the system I/O interface unit is arranged to "poll" the microNOVA ® I/O bus 15B to determine which devices are on such bus. A suitable microNOVA ® poll counter 62 supplies each of the expected device code words which identify the various devices which are likely to be used with the system, which device code words, for example, are 6-bit device codes supplied to the microNOVA ® I/O bus 15B via "low-byte" (a byte is 8 bits) shift register 69 from poll counter 68 to the output microNOVA ® bus pin 70 identified as IOD2 in FIG. 8A. The 6-bit device codes are supplied in parallel to shift register (S/R) 69 during the polling process and are in turn supplied serially to the microNOVA ® bus from shift register 69.

When microNOVA ® I/O devices, which communicate with the CPU on the microNOVA ® bus 15B, are interrogated with a device code signal for identification thereof, such devices supply a return identifiable I/O clock (IOCLK) signal at pin 71 to microNOVA ® finite state machine and control logic 72 if a device matching a particular device code is present on the microNOVA ® bus. Such operation is in contrast with devices on the ECLIPSE ® bus 15A for which no such identifiable I/O clock signal would be present if such devices were interrogated with the device codes. Because of such contrasting operations microNOVA ® devices can be "polled" to determine their presence on microNOVA ® bus 15B and a record of their presence kept in the system I/O interface unit 14.

Thus, receipt of an IOCLK signal at pin 71 from a particular I/O device on the microNOVA ® bus is supplied to control logic in the microNOVA ® finite state machine and control logic unit 72. Such logic generates a microNOVA ® exist signal (sometimes referred to as $\mu$NEXST) for supply to a microNOVA ® poll register 73 to indicate that an I/O device having such device code is present on the microNOVA ® bus.

The microNOVA ® poll store register 73, for example, is a 64-bit register, each bit corresponding to a particular device code (in a particular embodiment there being up to 64 possible microNOVA ® devices which can be present on the microNOVA ® bus). If a 6-bit device code representing a specified device which has been interrogated is provided at the input thereto from microNOVA ® poll counter 68, the particular bit associated therewith will be placed in a state which indicates the presence or absence of such device on the microNOVA ® bus, depending on whether a $\mu$NEXST signal is so generated. Accordingly, when all of the device codes have been polled, the microNOVA ® poll register 73 contains information as to the presence of all devices which are on the microNOVA ® I/O bus 15B.

Polling of the microNOVA ® bus is first performed at "start-up", the complete set of 64 possible devices in a particular embodiment, for example, being polled during one overall polling time interval before the overall system is put into operation. If, for example, the polling of each device takes 10 microseconds, or less, the complete poll can be accomplished in 600–700 microseconds. Once the system is in operation, updating of the poll store can be accomplished as devices previously indicated as not being present are turned on and devices previously indicated as present are turned off. Such updated polling can be accomplished at a 100 Hz rate, a single device being polled each 0.01 seconds (a completed update polling of all devices occurs every 0.6–0.7 seconds, for example).

In some cases a device will be turned on and could, therefore, be present on the microNOVA ® bus but the poll store may not indicate its presence (the updating for such device may not yet have occurred since the device came on line after the last update poll. If, under such condition, the device requests an interrupt operation, the interrupt request itself indicates the presence of the device and the microNOVA ® poll register is automatically updated by appropriate gating in the microNOVA ® finite state machine logic which provides a $\mu$NEXST signal to the poll register.

All devices which are not identified as being on the microNOVA ® I/O bus, but which are in communication with the system, will by the process of elimination be either on the ECLIPSE ® I/O bus 15A or on the system bus 11. As will be noted, a jumper register 74 is arranged so that an ECLIPSE ® ENABLE and/or a microNOVA ® ENABLE is provided. The presence or absence thereof is controlled by the presence or absence of a suitable "jumper" connection being reflected by the state of the "jumper" register 72. The following chart summarizes the conditions for identifying the devices involved:

| MicroNOVA ® ENABLE | ECLIPSE ® ENABLE | System | ECLIPSE ® | Micro-NOVA ® |
|---|---|---|---|---|
| 0 | 0 | Yes | No | No |
| 0 | 1 | E | E | No |
| 1 | 0 | Yes | No | Yes |
| 1 | 1 | E | E | Yes |

In the first condition where neither jumper connection is enabled the only devices identifiable are "system" devices. Where the ECLIPSE ® jumper is enabled but the microNOVA ® jumper is not, the system generates the ECLIPSE ® timing signals (signified as "E") but the interface unit 14 does not determine whether the devices are ECLIPSE ® or system devices. Where the microNOVA ® jumper is enabled but the ECLIPSE ® jumper is not, both microNOVA ® and system devices are identifiable. Where both jumpers are enabled, microNOVA ® devices can be identified but the system interface unit does not determine whether the devices are ECLIPSE ® or system devices (the ECLIPSE ® timing signals are generated). Accordingly, the polling technique permits the system I/O interface unit 14 to determine whether a particular I/O device must be communicated with either on the microNOVA ® I/O bus or on one of the other buses. If a microNOVA ® device is present on the microNOVA ® bus, its presence is indicated by the microNOVA ® poll store unit 73 which provides a microNOVA ® sensor signal, $\mu$NSNSR, to modify the operation of a master control finite state machine 75 so that its next state of operation provides the necessary control signals to control the operation of the microNOVA ® finite state machine 73 for microNOVA ® operation.

Control signals are shown in FIG. 8B for performing the polling process. The low byte shift register 69 is loaded with the device code at the assertion of LOAD POLL COUNTER by the microNOVA ® FSM 72, the poll count beginning at a poll count signal PLWC which increments the poll counter. The high byte shift register is loaded with a suitable instruction which can be selected to produce the least effect on the system (e.g., an IOSKP instruction in which data in all registers remain unchanged, etc.) at the assertion of a LOAD INST signal. If a return IOCLK is received at pin 71 a μNEXST signal is asserted by the microNOVA ® FSM 72 which signal, together with the device code applied to the address latch of the poll store 73, provides the indication of the presence of the particular device involved. When the complete poll count is completed for start-up, for example, a POLDNE signal is asserted by poll counter 68 for supply to the microNOVA ® FSM 73.

The PLWR signal is used on "interrupts" by a device when the CPU acknowledges the interrupt request by such device by asserting an interrupt acknowledge signal. At the assertion of a suitable interrupt acknowledge signal the device itself updates the poll store, via the supplying of its device code and the supplying of the PLWR signal by the master control PSM to the poll store.

For a poll store read operation, when an ADREN signal occurs, the poll store is accessed by the device code if an I/O instruction is present. The poll store then provides a μNSNSR signal to the master control FSM if such device is present.

A poll update request signal (μPUR) is supplied from the master control FSM 75 at the 100 Hz rate as determined by a 100 Hz input counter signal.

The required microNOVA ® instruction register and decode logic 76 and the microNOVA ® high byte register 77 for supplying the high byte data at microNOVA ® bus pin 78 (IOD1) are also shown in FIGS. 8A and 8B, as well as D-register 79 for shifting data to and from the $\overline{U}$ bus 65 and the microNOVA shifters 69 and 77, in accordance with standard microNOVA ® operation already well known to the art. Specific logic for the microNOVA ® FSM and control logic unit 72 and the master control FSM and control logic unit 75 are shown in FIGS. 9 and 10, respectively. The poll counter 68 and shift registers 69 and 77 are shown in FIG. 11, while the poll store register 73 is shown in FIG. 12.

The system I/O interface unit 14 is designed so as to be capable of operation at more than one input system clock frequency and is, therefore, adaptable for use with a system wherein the system clock is not expected to remain at a single fixed frequency for all operations. The frequency synthesizer unit 51 is provided so as to be responsive to one of a plurality of different selected input frequencies to produce the desired internal clock frequency required for operation of the internal devices of the interface unit and the desired master baud rate signal for operation of the asynchronous terminal system. In a particular embodiment, for example, the internal clock signal must have a substantially constant frequency of 1 MHz so as to provide for correct operation of the internal, or local, devices (such as the PIT and RTC devices mentioned above) and a substantially constant selected baud rate derived from the substantially constant master baud rate signal for the asynchronous terminal input/output logic.

A unique design for such frequency synthesis is disclosed in FIG. 13 wherein a more detailed block diagram thereof is depicted for generating the 1 MHz signal, for example. In a particular embodiment thereof, the clock rate of the selected input clock signal to the frequency synthesizer unit 51 may be one of eight different clock signals having clock periods which vary from 300 nanoseconds (nS) to 600 nanoseconds (see chart of FIG. 14). For example, in a particular embodiment eight different signals having clock periods, T, of 300 nS, 325 nS, 350 nS, 375 nS, 400 nS, 450 nS, 500 nS and 600 nS are utilized. The input frequency is identified by a 3-bit input signal (shown as $\overline{U}$-bus bits $\overline{U}$ 9,10,11) which is supplied to clock rate latch and decode ROM 80, which identifies which of the eight clock rates must be latched for supply to the frequency synthesizer. The selected clock rate so latched is supplied to a high-count position and parsing ROM 81, to a denominator select ROM 82, and a high-low integer select ROM 83. The functions thereof can be understood better with the help of an example explained with reference to the chart of FIG. 14.

Such chart depicts an example of the above frequency synthesizer technique for generating a pseudo-constant 1.0 MHz output clock for each of eight different input clock signals. As can be seen therein, except for the 500 nS clock signal, the clock periods for each of the eight frequencies involved are uneven multiples of the clock period for the desired 1.0 MHz signal. For example, an input clock signal having a 350 nS clock period completes 2 6/7 periods in the total 1000 nS clock period of a 1.0 MHz signal. Thus, for every 2 6/7 clock pulses of the 350 nS input clock signal, one clock pulse must be produced for the 1.0 MHz output clock signal, i.e., for any 20 input clock pulses, 7 output clock pulses are produced.

The chart of FIG. 14 depicts the parsing algorithm associated with each of the input clock signals. As can be seen therein, groups of input clock pulses are produced over repeatable or recycle time intervals the number of pulses in each group being selected as one of two numbers. Thus, for an input clock signal having a 350 nS period, seven groups of input pulses are utilized having either 3 pulses (high count) or 2 pulses (low count). The position of the high count groups is depicted by the "high-count position" column in accordance with the lettered column of the algorithm. Thus, the high count (3-pulse) groups are at the A and B positions of the seven group cycle (the low count group being at position C) so that the seven groups are as follows:

3 3 3 2 3 3 3

It should be noted that the uneven count (i.e., 2 6/7) identifies the algorithm to be used. Thus for the 350 nS input clock, the low/high counts vary between "2" (the whole number) and "3" (the next highest integer). The numerator of the fraction identifies the number of high-count position groups (i.e., "6" high count position groups), and the denominator identifies the total number of position groups ("7" position groups), sometimes referred to as the recycle time period. As another example the 300 nS clock signal requires a count of 3 3/9 and utilizes low/high counts of "3" and "4", a recycle time period (the denominator of the fraction) of "9" (i.e., 9 groups), three of which groups (the numerator of the fraction) are "high count" groups. The 3 high-count groups are placed in positions B and C. The other algorithms can be similarly described. In FIG. 13 the denominator select ROM 82 selects the appropriate denominator, or recycle time period, depending on which input clock RATE has been latched, the selected denominator (i.e., "7" for the 350 nS input clock) being identified by a 4-bit output of ROM 82. The ROM 81 identifies which of the eight parsing algorithms shown in the chart of FIG. 14 is to be used. In the example being discussed the parsing algorithm A·B representing seven groups of 350 nS pulses having 3 3 3 2 3 3 3 pulses in each group is selected.

It should be noted that in each parsing algorithm one of two numbers of pulses is used in each group. Thus, for the 350 nS algorithm either 3 pulses (the high count) or 2 pulses (the low count) are used, in the 300 nS algorithm either 4 pulses (the high count) or 3 pulses (the low count) are used. The parsing ROM 81 effectively determines for each demoninator count from denominator counter 84 which of the pulse counts (high or low) is to be used. Thus, for the 350 nS clock the parsing ROM 81 determines that the high count (3) is selected for the first three and the last three of the seven denominator counts and that the low count (2) is selected for the middle denominator count in the overall recycle counter period.

The high or low integer is then selected by high-low integer select ROM 83 to identify which of the counts on integer counter 85 must count so in order to supply one output pulse therefrom for each of the seven groups (i.e., whether the group contains 3 350 nS pulse counts or 2 350 nS pulse counts) so that for every 7 groups (making up 20 350 nS pulses in total) seven output pulses are supplied. Accordingly, as seen in the timing diagram of FIG. 15, the output of integer counter 85 is a 1 MHz clock signal, i.e., every 7000 nS (20×350 nS) the output counter 85 produces 7 pulses which is, of course, equivalent to one pulse every 1000 nS. A similar analysis is shown in FIG. 15 for the 450 nS input clock and can be made for each of the eight input clocks and associated parsing algorithms shown in the chart of FIG. 11.

As can be seen in FIG. 15 for the 350 nS input clock, while the pulse spacing of the output signal is not uniform, the number of pulses over each seven microseconds (i.e., 7000 nanoseconds) recycle time period is the same. Thus, while a timing error may occur during each recycle time period the error reduces to zero at the end thereof. For the 350 nS clock signal the maximum error which occurs during the recycle period is ±150 nS, as shown in FIG. 15, and the error at the end of the recycle period is zero. For the 450 nS input signal the maximum error is 300 nS and at the end of the recycle time period of 9000 nS, the error is zero. The maximum error for all of the input clock signals are shown in the chart of FIG. 14. Such errors are of little significance over the time periods required for operation of the internal units which utilize the 1 MHz signal so that, for all practical purposes, the 1 MHz signal has an essentially constant frequency. It should be noted that in no case is the maximum error greater than the time period of the input clock signal involved.

The above frequency synthesis unit provides an extremely adaptable system I/O interface unit 14 which can supply the desired master clock signal for the local or internal devices and the desired master baud rate signal for asynchronous terminal operation even when the system input clock signal has one of a plurality of different selectable frequencies. As mentioned above, the overall frequency synthesizer circuitry includes substantially two versions of the general unit shown in FIG. 13, one for the 1.0 MHz output signal and one for the master baud rate output. A baud rate selection circuit can be utilized to provide one of a plurality of 16 different baud rates from the master baud rate by suitable baud selection circuitry which provides integer multiples of the master baud rate as desired. The circuitry for dividing the master baud rate to obtain each of 16 different baud rates is well known to those in the art. Moreover, the 1.0 MHz clock rate can also be appropriately divided down to produce clock rates which are integer submultiples of the 1.0 MHz master clock rate for various internal devices as required. Lists of the exemplary baud rates which can be derived from a master baud rate of 614,400 Hz and exemplary local counter output signals (decode counter clocks) which can be derived from a master 1.0 MHz clock signal are provided below.

| Baud Rates | Local Counter Output Signals |
| --- | --- |
| 50 | 1.0 MHz |
| 75 | 100 KHz |
| 110 | 10 KHz |
| 134.5 | 1.0 KHz |
| 150 | |
| 200 | |
| 300 | |
| 600 | |
| 1200 | |
| 1800 | |
| 2000 | |
| 2400 | |
| 4800 | |
| 9600 | |
| 19200 | |
| 38400 | |

While specific implementations of the two-level micro-modification technique, the system bus protocol techniques, the I/O bus polling techniques, and the frequency synthesizing technique are disclosed above for the particular embodiment of the invention, the invention is not limited thereto. Modifications thereof within the spirit and scope of the invention will occur to those in the art. Hence, the invention is not to be construed as limited to the particular embodiments described except as defined by the appended claims.

APPENDIX A

HORIZONTAL MICROINSTRUCTION SET

ABUS field (4 bits wide, 16 encodings)

| | |
| --- | --- |
| V1 | vertical modifier 1 |
| GI | GI |
| GD | GD |
| GR | GR |
| GL | GL |
| IRESX | IRE<8-15>, sign extended if IRE<6-7> .NE. 0 |
| IRD | IRD |
| ACSR | ACSR |
| BIT | 2 ** (15 − GR<12-15>) |
| BONE | 377 (byte of 1s right justified) |

APPENDIX A-continued

HORIZONTAL MICROINSTRUCTION SET

ABUS field (4 bits wide, 16 encodings)

| | |
|---|---|
| ZERO | 0 |

NOTES on the use of ABUS micro-orders
(1) Any microinstruction which uses BIT must be preceeded by at least one microinstruction which does not modify GR (it takes one T period for BIT to settle once GR is written)
(2) ACSR is loaded with IRD<1-2> when IRE is loaded with IRD.
ACSR is loaded with CBUS<1-2> when IRE is loaded with CBUS

BBUS field (4 bits wide, 16 encodings)

| | |
|---|---|
| V2 | vertical modifier 2 |
| GI | GI |
| GD | GD |
| GR | GR |
| GL | GL |
| PCE | PCE |
| PCD | PCD |
| LIT | V1!!V2 right justified |
| IREIO | standard I/O instruction format based on IRE (see notes) |
| XR12 | 0 (PCD, AC2, AC3) if IRE<1-2> = 0 (1, 2, 3) |
| XR67 | 0 (PCx, AC2, AC3) if IRE<6-7> = 0 (1, 2, 3), x = PCE if EFA, x = PCD if XEFA |
| MONE | −1 |

NOTES on the use of BBUS micro-orders
(1) IREIO is used to trigger the actual I/O to devices CPU and MAP which are partially implemented on ALPHA (RIO and WIO normally trigger the I/O). Caution should be exercised when coding IREIO to execute during a DECODE CYCLE
(2) IREIO word format is as follows:
IREIO<0> = 0, IREIO<1> is reserved
IREIO<10-15> is the device code

| System Function IREIO<2-4> | Function IREIO<5-6> | Direction IREIO<7> | Control IREIO<8-9> |
|---|---|---|---|
| 000 NO-OP | 00 STATUS | 0 OUT | 00 NO-OP |
| 001 INTA | 01 A REG | 1 IN | 01 START |
| 010 MSKO | 10 B REG | | 10 CLEAR |
| 011 IORST | 11 C REG | | 11 PULSE |
| 100 DCHA | | | |
| 101 DCHI | | | |
| 110 DCHO | | | |
| 111 spare | | | |

DCHA, DCHI, and DCHO are not generated by ALPHA but are used by EPIC

ALU field (4 bits wide, 16 encodings)

| | |
|---|---|
| V1 | vertical modifier 1 |
| COM | A' |
| NEG | −A |
| MOV | pass A |
| INC | A+1 |
| ADC | B−A−1 |
| SUB | B−A |
| ADD | A+B |
| AND | A^B |
| AD1 | A+B+1 |
| ANC | A'^B |
| MUL | unsigned multiply iteration step |
| MULS | signed multiply iteration step |
| DIV | unsigned divide iteration step |

NOTES on the use of ALU micro-orders
(1) A and B refer to the contents of ABUS and BBUS respectively
(2) ALC hardware can directly control ALU; ALU field mnemonics are consistent with ALC instructions
(3) MUL, MULS, and DIV are defined by the 'ALPHA ALU LOGICAL SPECIFICATION'
(4) GR must not be loaded from memory prior to a MULTIPLY CYCLE

SHF field (4 bits wide, 16 encodings)

| | |
|---|---|
| V2 | vertical modifier 2 |
| PASS | pass |
| PASS0 | pass, XBUS<0> = 0 |
| PASSC | pass, XBUS<0> = CARRY |
| SHL | shift left, pull x into LSB (see note) |
| LSHR | logical shift right, pull x into MSB (see note) |
| ASHR | arithmetic shift right, do not change sign bit |
| SHLC | shift left, pull CARRY into LSB |
| SHRC | shift right, pull CARRY into MSB |
| SWAP | swap bytes |
| ROL | 16 bit rotate left |
| ROR | 16 bit rotate right |
| ROLC | 17 bit rotate left, CARRY participates |
| RORC | 17 bit rotate right, CARRY participates |

NOTES on the use of SHF micro-orders
(1) For SHL and LSHR: x = 0 unless ALU field is used to invoke multiply or divide

DEST field (4 bits wide, 16 encodings)

| | |
|---|---|
| V1 | vertical modifier 1 |
| V2 | vertical modifier 2 |
| GI | GI |
| GD | GD |
| GR | GR |
| GL | GL |
| PCF | PCF |
| IRE | IRE |
| NOLD | no load |

NOTES on the use of DEST micro-orders
(1) For IRE, ACSR is also loaded with CBUS<1-2> unless CBUS is sourced by MBUS. Delay at least one T period between IRE loading and use of ACSR or ACS micro-orders

ADR field (3 bits wide, 8 encodings)

| | |
|---|---|
| V2 | vertical modifier 2 |
| NONE | no address |
| SP | 40 (stack pointer) |
| FP | 41 (frame pointer) |
| SL | 42 (stack limit) |
| GI | GI |
| GD | GD |

NOTES on the use of ADR micro-orders
(1) Memory address source drives MBUS during PHASE 1 only
(2) MBUS<0> is forced to 0 unless RHYP/WHYP is issued or RLCL/WLCL is issued or HYPMOD (hyperspace mode flag) = 1

MEM field (2 bits wide, 4 encodings)

| | |
|---|---|
| V2 | vertical modifier 2 |
| NOP | no operation |
| RM | read memory |
| WM | write memory |

NOTES on the use of MEM micro-orders
(1) Read operations cause CBUS to be sourced by MBUS (MBB) during PHASE 2 (read data)
(2) Write operations cause MBUS to be sourced by ABUS (MBP) during PHASE 2 (write data)
(3) CBUS is sourced by XBUS whenever a read operation is not taking place (XTC)

TEST field (4 bits wide, 16 encodings)

| | |
|---|---|
| V2 | vertical modifier 2 |
| NOP | SKIP = SKIP |
| SET | SKIP = 1 |
| CLEAR | SKIP = 0 |
| GEQZ | SKIP = 1 if GI increments to zero (GIINC or GIAINC) or GD decrements to zero (GDDEC or GDADEC), else SKIP = 0 |
| INTP | SKIP = 1 if PI is pending, else SKIP = 0 |
| ACSRQ | SKIP = 1 if ACSR = IRE<3-4>, else SKIP = 0 |
| UCRYB | SKIP = 0 if carry out of ALU<0> = 1, else SKIP = 1 |
| SCRYB | SKIP = 0 if signed carry out of ALU<0> = 1, else SKIP = 1 (see note) |
| DCRY | SKIP = 1 if decimal overflow or decimal borrow occurs, else SKIP = 0 (see note) |

-continued

| TEST field (4 bits wide, 16 encodings) | |
|---|---|
| SHOUT | SKIP = 1 if SHIFTER rotates or shifts out a 1, else SKIP = 0 |
| XEQZ | SKIP = 1 if XBUS<0-15> = 0, else SKIP = 0 |
| XNEG | SKIP = 1 if XBUS<0> = 1, else SKIP = 0 |
| IOSKP | SKIP = 1 if the I/O SKIP condition being tested is true, else SKIP = 0 |
| NMIP | SKIP = 1 if NMI is pending, else SKIP = 0 |
| OVFLO | SKIP = 1 if carry out of ALU<0> and carry into ALU<0> do not match, else SKIP = 0 |

NOTES on the use of TEST micro-orders
(1) ACSR is loaded with IRD<1-2> when IRE is loaded with IRD. ACSR is loaded with CBUS<1-2> when IRE is loaded with CBUS
(2) SCRYB is defined by the 'ALPHA ALU LOGICAL SPECIFICATION'
(3) DCRY = (carry out of ALU<12> .XOR. SUB) .OR. ([ALU<12-15> > 9.] .AND. ADD)
(4) UCRYB may be used for unsigned integer comparisons and SCRYB may be used for signed integer comparisons
(5) The increment/decrement happens first if ACSR is incremented/decremented and ACSRQ is issued. Likewise for the increment/decrement using GEQZ
(6) For IOSKP, the truth of the I/O skip condition is determined by the contents of the ABUS (DIS word) and IRE<8-9>. The DIS word format is as follows:
DIS<0> = DONE (POWER FAIL if DIS 77)
DIS<1> = BUSY (ION if DIS 77)
DIS<2-14> are reserved
DIS<15> = NMI caused by HALT if DIS 77 else reserved

| RAND field (4 bits wide, 16 encodings) | |
|---|---|
| V1 | vertical modifier 1 |
| NOP | no operation |
| IR5TOI | I (indirect enable) = IRE<5> |
| A0TOI | I (indirect enable) = ABUS<0> |
| GIINC | increment GI |
| GDDEC | decrement GD |
| GIANIC | increment GI and ACSR |
| GDADEC | decrement GD and ACSR |
| SETCRY | CARRY = 1 |
| CLRCRY | CARRY = 0 |
| GLL | shift GL left, pull x into LSB (see note) |
| GRR | shift GR right, pull x into MSB (see note) |
| GLLGDD | decrement GD, shift GL left and pull x into LSB (see note) |
| GRRGDD | decrement GD, shift GR right and pull x into MSB (see note) |
| HYPON | HYPMOD (hyperspace mode flag) = 1 |

NOTES on the use of RAND micro-orders
(1) For GLL, GRR, GLLGDD, and GRRGDD: if multiply or divide is not invoked using the ALU field, then x equals the bit rotated or shifted out of the SHIFTER (x = 0 if SHIFTER is not rotating or shifting), else MUL/DIV logic determines x

APPENDIX B
VERTICAL MICROINSTRUCTION SET

ADRH field (6 bits wide, 64 encodings)

Each encoding selects one of 64 horizontal microinstructions in the HPLA. The selected horizontal is executed. If the executed horizontal sets I (indirect enable) [a horizontal which sets I is called an 'indirect initiator'], then field V2 is saved in the 4 bit wide instruction class register (ICR) and used to control indirect address chains and the MAP. The ICR is interpreted as follows:

| ICR<0> | (1000) | Jump-type instruction, PCF is loaded whenever GI is loaded |
| ICR<1> | (0100) | reserved |
| ICR<2-3> | (0001) | MAP indirect cycle turn-on |
| | (0011) | MAP single cycle turn-on and/or indirect cycle turn-on |

The ICR is cleared by every DECODE CYCLE whose vertical does not specify a horizontal that is an indirect initiator. The vertical sequenced to following an indirect initiator is called the 'shadow'

| V1 field / ABUS modification (4 bits wide, 16 encodings) | |
|---|---|
| AC0 | AC0 |

| V1 field / ABUS modification (4 bits wide, 16 encodings) | |
|---|---|
| AC1 | AC1 |
| AC2 | AC2 |
| AC3 | AC3 |
| ACS | ACx, x = ACSR |
| ACD | ACx, x = IRE<3-4> |
| GI | see horizontal |
| GD | see horizontal |
| GR | see horizontal |
| GL | see horizontal |
| IRESX | see horizontal |
| IRD | see horizontal |
| ACSR | see horizontal |
| BIT | see horizontal |
| BONE | see horizontal |
| ZERO | see horizontal |

NOTES on the use of ABUS modifiers
(1) ACSR is loaded with IRD<1-2> when IRE is loaded with IRD. ACSR is loaded with CBUS<1-2> when IRE is loaded with CBUS

| V2 field / BBUS modification (4 bits wide, 16 encodings) | |
|---|---|
| AC0 | AC0 |
| AC1 | AC1 |
| AC2 | AC2 |
| AC3 | AC3 |
| ACS | ACx, x = ACSR |
| ACD | ACx, x = IRE<3-4> |
| GI | see horizontal |
| GD | see horizontal |
| GR | see horizontal |
| GL | see horizontal |
| PCE | see horizontal |
| PCD | see horizontal |
| LIT | see horizontal |
| IREIO | see horizontal |
| MONE | see horizontal |

NOTES on the use of BBUS modifiers
(1) ACSR is loaded with IRD<1-2> when IRE is loaded with IRD. ACSR is loaded with CBUS<1-2> when IRE is loaded with CBUS

| V1 field / ALU modification (4 bits wide, 16 encodings) | |
|---|---|
| COM | see horizontal |
| NEG | see horizontal |
| MOV | see horizontal |
| INC | see horizontal |
| ADC | see horizontal |
| SUB | see horizontal |
| ADD | see horizontal |
| AND | see horizontal |
| AD1 | see horizontal |
| ANC | see horizontal |

| V2 field / SHF modification (4 bits wide, 16 encodings) | |
|---|---|
| PASS | see horizontal |
| PASS0 | see horizontal |
| PASSC | see horizontal |
| SHL | see horizontal |
| LSHR | see horizontal |
| ASHR | see horizontal |
| SHLC | see horizontal |
| SHRC | see horizontal |
| SWAP | see horizontal |
| ROL | see horizontal |
| ROR | see horizontal |
| ROLC | see horizontal |
| RORC | see horizontal |

| V1 and V2 fields / DEST modification (4 bits wide, 16 encodings) | |
|---|---|
| AC0 | AC0 |
| AC1 | AC1 |
| AC2 | AC2 |
| AC3 | AC3 |
| ACS | ACx, x = ACSR |
| ACD | ACx, x = IRE<3-4> |
| GI | see horizontal |
| GD | see horizontal |
| GR | see horizontal |
| GL | see horizontal |
| PCF | see horizontal |
| IRE | see horizontal |
| NOLD | see horizontal |

NOTES on the use of DEST modifiers
(1) For IRE, ACSR is also loaded with CBUS<1-2> unless CBUS is sourced by MBUS. Delay at least one T period between IRE loading and use of ACSR or ACS micro-orders

| V2 field / ADR modification (4 bits wide, 8 encodings) | |
|---|---|
| NONE | see horizontal |
| SP | see horizontal |
| FP | see horizontal |
| SL | see horizontal |
| GI | see horizontal |
| GD | see horizontal |

NOTES on the use of ADR modifiers
(1) There are only 8 encodings since horizontal's ADR field is only 3 bits wide
(2) Memory address formats are as follows:
USER SPACE, MEMCYC = 1
address<0> = 0
address<1-15> = register select
HYPERSPACE, MEMCYC = 1
address<0> = 1
address<1-15> = register select
I/O SPACE, MEMCYC = 0
same as IREIO word format
LOCAL SPACE, MEMCYC = 0
address<0> = 1
address<1-5> = sub-register select
address<6-9> = register select
address<10-15> = device select

| V2 field / MEM modification (4 bits wide, 16 encodings) | |
|---|---|
| NOP | see horizontal |
| RM | see horizontal |
| WM | see horizontal |
| RMOD | read and lock memory |
| WHM | write memory, high byte only |
| WLM | write memory, low byte only |
| RHYP | read hyperspace |
| WHYP | write hyperspace |
| RIO | read I/O |
| WIO | write I/O |
| RLCL | read local |
| WLCL | write local |
| XCT | take data on memory bus into IRF, assert FETCH |
| MAPON | turn MAP on if armed |
| MAPOFF | turn MAP off |

NOTES on the use of MEM modifiers
(1) For RMOD, memory is un-locked by the next memory operation if it is not another RMOD
(2) For XCT, mocrocode should force a memory cycle (to fake out IR PIPES) using a WLCL to device 0 register 0
(3) MAPOFF will inhibit I/O interrupts until after the next macroinstruction has begun execution. This feature does not work if MAPOFF is coded to execute during a DECODE CYCLE

| V2 field / TEST modification (4 bits wide, 16 encodings) | |
|---|---|
| NOP | see horizontal |
| SET | see horizontal |
| CLEAR | see horizontal |
| GEQZ | see horizontal |
| INTP | see horizontal |
| ACSRQ | see horizontal |

-continued

| V2 field / TEST modification (4 bits wide, 16 encodings) | |
|---|---|
| UCRYB | see horizontal |
| SCRYB | see horizontal |
| DCRY | see horizontal |
| SHOUT | see horizontal |
| XEQZ | see horizontal |
| XNEG | see horizontal |
| IOSKP | see horizontal |
| NMIP | see horizontal |
| OVFLO | see horizontal |

| V1 field / RAND modification (4 bits wide, 16 encodings) | |
|---|---|
| NOP | see horizontal |
| IR5TOI | see horizontal |
| A0TOI | see horizontal |
| GIINC | see horizontal |
| GDDEC | see horizontal |
| GIAINC | see horizontal |
| GDADEC | see horizontal |
| SETCRY | see horizontal |
| CLRCRY | see horizontal |
| GLL | see horizontal |
| GRR | see horizontal |
| GLLGDD | see horizontal |
| GRRGDD | see horizontal |
| HYPON | see horizontal |

| NAM field (4 bits wide, 16 encodings) | |
|---|---|
| NEXT | VPC = VPC + 1 |
| SKIP | VPC = VPC + 1 + 1 |
| JUMP | unconditional transfer [VPC = V1!!V2] |
| DECODE | begin interpretation of a new macroinstruction |
| SDCODE | DECODE but allow a macro skip |
| TJUMP | if SKIP = 1 then JUMP, else NEXT |
| FJUMP | if SKIP = 0 then JUMP, else NEXT |
| TSKIP | if SKIP = 1 then SKIP, else NEXT |
| FSKIP | if SKIP = 0 then SKIP, else NEXT |
| TREPT | if SKIP = 1 then JUMP to current VPC, else NEXT |
| FREPT | if SKIP = 0 then JUMP to current VPC, else NEXT |
| TDCODE | if SKIP = 1 then DECODE, else NEXT |
| FDCODE | if SKIP = 0 then DECODE, else NEXT |
| CALL | subroutine call [VPCSAV = VPC+1, VPC = V1!!V2] |

-continued

NAM field (4 bits wide, 16 encodings)

| | |
|---|---|
| RTRN | subroutine return [VPC = VPCSAV] |

NOTES on the use of NAM micro-orders
(1) The NAM field senses the old value of the SKIP flag, not the new value which is determined by the horizontal selected by the currently executing vertical
(2) Special hardware conditions such as NMI (NonMaskable Interrupt) are handled during a DECODE CYCLE
(3) If SKIP = 1 and an SDCODE is issued, then the macroinstruction in IRD is not executed. The next macroinstruction to be executed is found in IRF (the macroinstruction in IRD is skipped). This is called 'macro skip' and is used by macroinstruction interpreters such as CLM
(4) It is illegal to write PCF or read IRD if a DECODE is issued (i.e. you can't start the autonomous fetch unit and DECODE simultaneously)
(5) VPC sequencing is polynomial, not binary
(6) SKIP is cleared by every DECODE CYCLE

APPENDIX C

STARTING MICROINSTRUCTION SET

ADRH, V1, and V2 fields (total 14 bits wide)

Same as in vertical control ROM (VCR)

STARTING MICROINSTRUCTION SET

ADRV field (9 bits wide, 512 encodings)

Each encoding is a pointer to one of 288 vertical microinstructions in the VCR. This pointer is loaded into the VERTICAL PC (VPC) to begin normal vertical sequencing through the VCR D field (1 bit wide, 2 encodings)

| | |
|---|---|
| N | do not invoke a macroinstruction decode |
| Y | invoke a macroinstruction decode and allow a macro skip |

NOTES
(1) The D field is used by macroinstruction interpreters which consist of only one vertical microinstruction (e.g. ALCs). In those cases, the VPLA is not accessed
(2) The ADRV field is ignored if a macroinstruction decode is invoked using the D field
(3) If SKIP = 1 and a macroinstruction decode is invoked using the D field, then the macroinstruction in IRD is not executed. The next macroinstruction to be executed is found in IRF (the macroinstruction in IRD is skipped). This is called 'macro skip' and is used by the ALCs and others
(4) It is illegal to write PCF or read IRD if a macroinstruction decode is invoked (i.e. you can't start the autonomous fetch unit and decode simultaneously)
(5) SKIP is cleared by every DECODE CYCLE

APPENDIX D

SPECIFIC HORIZONTAL FIELDS

| HORIZONTAL PLA | | | | | | | | | | |
|---|---|---|---|---|---|---|---|---|---|---|
| | LABEL | ABUS | BBUS | ALU | SHF | DEST | ADR | MEM | TEST | RAND |
| 0000 | NOOP: | — | — | — | PASS | NOLD | NONE | NOP | NOP | NOP |
| 0001 | RMEM: | V1 | — | — | PASS | V1 | V2 | RM | NOP | NOP |
| 0002 | WMEM: | V1 | — | — | PASS | NOLD | V2 | WM | NOP | NOP |
| 0003 | XMEMGI: | V1 | — | MOV | PASS | V1 | GIADR | V2 | NOP | NOP |
| 0004 | XMEMGD: | V1 | — | MOV | PASS | V1 | GDADR | V2 | NOP | NOP |
| 0005 | XMEMIG: | V1 | — | MOV | PASS | V1 | GIADR | V2 | NOP | GIINC |
| 0006 | XMEMDG: | V1 | — | MOV | PASS | V1 | GDADR | V2 | NOP | GDDEC |
| 0007 | COMH: | V1 | — | COM | PASS | V2 | NONE | NOP | NOP | NOP |
| 0010 | NEGH: | V1 | — | NEG | PASS | V2 | NONE | NOP | NOP | NOP |
| 0011 | MOVH: | V1 | — | MOV | PASS | V2 | NONE | NOP | NOP | NOP |
| 0012 | INCH: | V1 | — | INC | PASS | V2 | NONE | NOP | NOP | NOP |
| 0013 | ADCH: | V1 | V2 | ADC | PASS | V2 | NONE | NOP | NOP | NOP |
| 0014 | SUBH: | V1 | V2 | SUB | PASS | V2 | NONE | NOP | NOP | NOP |
| 0015 | ADDH: | V1 | V2 | ADD | PASS | V2 | NONE | NOP | NOP | NOP |
| 0016 | ANDH: | V1 | V2 | AND | PASS | V2 | NONE | NOP | NOP | NOP |
| 0017 | AD1H: | V1 | V2 | AD1 | PASS | V2 | NONE | NOP | NOP | NOP |
| 0020 | ANCH: | V1 | V2 | ANC | PASS | V2 | NONE | NOP | NOP | NOP |
| 0021 | DECH: | V1 | MONE | ADD | PASS | V2 | NONE | NOP | NOP | NOP |
| 0022 | MOVIT: | V1 | — | MOV | PASS | GI | NONE | NOP | V2 | NOP |
| 0023 | ADDHC: | V1 | V2 | ADD | PASS | V2 | NONE | NOP | UCRYB | NOP |
| 0024 | GIDAS: | GD | GI | V1 | V2 | GD | NONE | NOP | NOP | NOP |
| 0025 | GIDAT: | GD | GI | V1 | PASS | GD | NONE | NOP | V2 | NOP |
| 0026 | GRLAS: | GL | GR | V1 | V2 | GL | NONE | NOP | NOP | NOP |
| 0027 | GRLAT: | GL | GR | V1 | PASS | GL | NONE | NOP | V2 | NOP |
| 0030 | MULH: | V1 | V2 | MUL | LSHR | V2 | NONE | NOP | GEQZ | GRRGDD |
| 0031 | MULSH: | V1 | V2 | MULS | LSHR | V2 | NONE | NOP | GEQZ | GRRGDD |
| 0032 | DIVH: | V1 | V2 | DIV | ROLC | V2 | NONE | NOP | GEQZ | GLLGDD |
| 0033 | SHIFT: | V1 | — | MOV | V2 | V1 | NONE | NOP | NOP | NOP |
| 0034 | SHIFTO: | V1 | — | MOV | V2 | V1 | NONE | NOP | SHOUT | NOP |
| 0035 | SHIFTN: | V1 | — | MOV | V2 | V1 | NONE | NOP | XNEG | NOP |
| 0036 | TST: | V1 | — | MOV | PASS | NOLD | NONE | NOP | V2 | NOP |
| 0037 | RANTST: | GI | — | MOV | PASS | NOLD | NONE | NOP | V2 | V1 |
| 0040 | LITGI: | ZERO | LIT | ADD | PASS | GI | NONE | NOP | NOP | NOP |
| 0041 | LITGD: | ZERO | LIT | ADD | PASS | GD | NONE | NOP | NOP | NOP |
| 0042 | LITGR: | ZERO | LIT | ADD | PASS | GR | NONE | NOP | NOP | NOP |
| 0043 | LITGL: | ZERO | LIT | ADD | PASS | GL | NONE | NOP | NOP | NOP |
| 0044 | LITSGI: | ZERO | LIT | ADD | SWAP | GI | NONE | NOP | NOP | NOP |
| 0045 | ADDLIT: | GI | LIT | ADD | PASS | GI | NONE | NOP | NOP | NOP |
| 0046 | MOVHR0: | ZERO | V2 | ADD | PASS0 | V1 | NONE | NOP | NOP | NOP |
| 0047 | INCHR0: | ZERO | V2 | AD1 | PASS0 | V1 | NONE | NOP | NOP | NOP |
| 0050 | UCMPGT: | V1 | V2 | SUB | PASS | NOLD | NONE | NOP | UCRYB | NOP |
| 0051 | UCMPGE: | V1 | V2 | ADC | PASS | NOLD | NONE | NOP | UCRYB | NOP |
| 0052 | SCMPGT: | V1 | V2 | SUB | PASS | NOLD | NONE | NOP | SCRYB | NOP |
| 0053 | SCMPGE: | V1 | V2 | ADC | PASS | NOLD | NONE | NOP | SCRYB | NOP |
| 0054 | COMPEQ: | V1 | V2 | SUB | PASS | NOLD | NONE | NOP | XEQZ | NOP |
| 0055 | SDSHL: | V1 | — | MOV | SHL | V1 | NONE | NOP | V2 | GLLGDD |
| 0056 | SDSHR: | V1 | — | MOV | LSHR | V1 | NONE | NOP | V2 | GRRGDD |
| 0057 | EFA: | IRESX | XR67 | ADD | PASS | GI | NONE | NOP | CLEAR | IR5TOI |
| 0060 | XEFA12: | IRD | XR12 | ADD | PASS | GI | NONE | NOP | CLEAR | A0TOI |
| 0061 | XEFA67: | IRD | XR67 | ADD | PASS | GI | NONE | NOP | CLEAR | A0TOI |
| 0062 | MOVIII: | V1 | — | MOV | PASS | GI | NONE | NOP | CLEAR | A0TOI |
| 0063 | RMEMI: | V1 | — | — | PASS | V1 | GIADR | RM | V2 | GIINC |
| 0064 | RMEMD: | — | — | — | PASS | V1 | GDADR | RM | V2 | GDADEC |

APPENDIX D-continued

SPECIFIC HORIZONTAL FIELDS

| HORIZONTAL PLA LABEL | ABUS | BBUS | ALU | SHF | DEST | ADR | MEM | TEST | RAND |
|---|---|---|---|---|---|---|---|---|---|
| 0065 WMEMI: | V1 | — | — | PASS | NOLD | GIADR | WM | V2 | GIAINC |
| 0066 WMEMD: | V1 | — | — | PASS | NOLD | GDADR | WM | V2 | GDDEC |
| 0067 INCT: | V1 | — | INC | PASS | V1 | NONE | NOP | V2 | NOP |
| 0070 DECT: | V1 | MONE | ADD | PASS | V1 | NONE | NOP | V2 | NOP |
| 0071 NEGT: | V1 | — | NEG | PASS | V1 | NONE | NOP | V2 | NOP |
| 0072 HIBYTE: | BONE | V2 | ANC | SWAP | V1 | NONE | NOP | NOP | NOP |
| 0073 LOBYTE: | BONE | V2 | AND | PASS | V1 | NONE | NOP | NOP | NOP |
| 0074 MASKTZ: | V1 | V2 | AND | PASS | NOLD | NONE | NOP | XEQZ | NOP |
| 0075 SHOGI: | V1 | — | MOV | V2 | GI | NONE | NOP | SHOUT | NOP |
| 0076 SHOGD: | V1 | — | MOV | V2 | GD | NONE | NOP | SHOUT | NOP |

.LOC 77 ; IND is locked to the indirect address chaining mechanism

| 0077 IND: | — | — | — | PASS | GI | GIADR | RM | NOP | NOP |

APPENDIX E

HORIZONTAL MICROINSTRUCTION MICRO-ORDER ENCODINGS

ALPHA - MICROINSTRUCTION MICRO-ORDER ENCODINGS

| | 0 | 3 4 | 7 8 | 11 12 | 15 16 | 19 20 | 22 23 | 26 27 | 30 31 34 |
|---|---|---|---|---|---|---|---|---|---|
| HCR* | ABUS | BBUS | ALU | SHF | DEST | ADR | MEM | TEST | RAND |
| 0000 | AC0 | AC0 | COM | PASS | V1 | NONE | NOP | NOP | NOP |
| 0001 | AC1 | AC1 | NEG | ASHR | V1 | SP | WM | V2 | V1 |
| 0010 | AC2 | AC2 | MOV | PASS0 | V2 | GDADR | RM | ACSRQ | A0TOI |
| 0011 | AC3 | AC3 | INC | PASSC | V2 | SL | V2 | GEQZ | NOP |
| 0100 | GI | GI | ADC | SHL | GI | GIADR | | XEQZ | GLL |
| 0101 | GD | GD | SUB | ROL | GD | FP | | SHOUT | GLLGDD |
| 0110 | GR | GR | ADD | SHLC | GR | V2 | | INTP | CLRCRY |
| 0111 | GL | GL | AD1 | ROLC | GL | V2 | | NMIP | GDDEC |
| 1000 | ZERO | MONE | MUL | LSHR | NOLD | | | XNEG | GIINC |
| 1001 | ZERO | XR67 | MULS | ROR | NOLD | | | IOSKP | GIAINC |
| 1010 | BONE | PCE | DIV | SHRC | PCF | | | DCRY | IR5TOI |
| 1011 | IRD | PCD | AD1 | RORC | PCF | | | SCRYB | HYPON |
| 1100 | IRESX | IREIO | ANC | SWAP | IRE | | | UCRYB | GRR |
| 1101 | BIT | LIT | ANC | SWAP | IRE | | | CLEAR | GRRGDD |
| 1110 | ACSR | XR12 | AND | V2 | NOLD | | | OVFLO | SETCRY |
| 1111 | V1 | V2 | V1 | V2 | NOLD | | | SET | GDADEC |
| MODIFIER | V1 | V2 | V1 | V2 | V1!V2 | V2 | V2 | V2 | V1 |
| 0000 | AC0 | AC0 | COM | PASS | AC0 | NONE | NOP | NOP | NOP |
| 0001 | AC1 | AC1 | NEG | ASHR | AC1 | SP | WM | NOP | NOP |
| 0010 | AC2 | AC2 | MOV | PASS0 | AC2 | GDADR | RM | ACSRQ | A0TOI |
| 0011 | AC3 | AC3 | INC | PASSC | AC3 | SL | WHM | GEQZ | NOP |
| 0100 | GI | GI | ADC | SHL | GI | GIADR | RMOD | XEQZ | GLL |
| 0101 | GD | GD | SUB | ROL | GD | FP | WLM | SHOUT | GLLGDD |
| 0110 | GR | GR | ADD | SHLC | GR | NONE | RHYP | INTP | CLRCRY |
| 0111 | GL | GL | AD1 | ROLC | GL | NONE | WHYP | NMIP | GDDEC |
| 1000 | ACS | ACS | ADC | LSHR | ACS | NONE | RIO | XNEG | GIINC |
| 1001 | ACD | ACD | SUB | ROR | ACD | SP | WIO | IOSKP | GIAINC |
| 1010 | BONE | PCE | ADD | SHRC | PCF | FP | RLCL | DCRY | IR5TOI |
| 1011 | IRD | PCD | AD1 | RORC | PCF | SL | WLCL | SCRYB | HYPON |
| 1100 | IRESX | IREIO | ANC | SWAP | IRE | GI | MAPON | UCRYB | GRR |
| 1101 | BIT | LIT | ANC | SWAP | IRE | GD | XCT | CLEAR | GRRGDD |
| 1110 | ACSR | MONE | AND | SWAP | NOLD | NONE | MAPOFF | OVFLO | SETCRY |
| 1111 | ZERO | MONE | AND | SWAP | NOLD | NONE | ? | SET | GDADEC |
| VPLA | NAM | SPLA | D | CROM | CNAM | CNAMX | CNAMX | NAM | DEC |
| 0000 | NEXT | 0000 | N | 0000 | JUMP | NOP | WAIT0 | NEXT | NO |
| 0001 | JUMP | 0001 | Y | 0001 | CALL | SETA | WAIT1 | DECODE | YES |
| 0010 | SKIP | 0010 | | 0010 | FREPT | SETB | WAIT2 | TREPT | |
| 0011 | FSKIP | 0011 | | 0011 | TREPT | SETC | WAIT3 | FREPT | |
| 0100 | RTRN | 0100 | | 0100 | DECODE | CLRA | FLAGA | | |
| 0101 | CALL | 0101 | | 0101 | RTRN | CLRB | FLAGB | | |
| 0110 | ? | 0110 | | 0110 | RLNEXT | CLRC | FLAGC | | |
| 0111 | FJUMP | 0111 | | 0111 | RLNEXT | CLRX | FLAGC | | |
| 1000 | DECODE | 1000 | | 1000 | TJUMP | | | | |
| 1001 | TDCODE | 1001 | | 1001 | FJUMP | | | | |
| 1010 | SDCODE | 1010 | | 1010 | TCALL | | | | |
| 1011 | FDCODE | 1011 | | 1011 | FCALL | | | | |
| 1100 | TSKIP | 1100 | | 1100 | TRTRN | | | | |
| 1101 | TJUMP | 1101 | | 1101 | FRTRN | | | | |
| 1110 | TREPT | 1110 | | 1110 | RJUMP | | | | |
| 1111 | FREPT | 1111 | | 1111 | RJUMP | | | | |

*Horizontal Control ROM

What is claimed is:

a central processor unit having means responsive to macroinstructions for providing decoded macroinstructions for use in generating one or more microinstructions, said central processor unit further including first control store means for providing one or more microinstructions in response to identification signals, one or more selected fields of each of said microinstructions being capable of modification;

second control store means for providing a plurality of microinstruction portions, one or more of said second plurality of microinstruction portions providing modifier fields containing information usable for modifying said one or more selected fields of said one or more microinstructions, said second control store means being responsive to a said decoded macroinstruction for producing said plurality of microinstruction portions; and modification means responsive to said one or more microinstructions provided by said first control store means and to the modifier fields of said one or more microinstruction portions provided by said second control store means for providing modified microinstructions for performing said data processing operation.

2. In a data processing system in accordance with claim 1 wherein said plurality of microinstruction portions further contain a sequencing field containing information at least capable of identifying successive microinstruction portions which are used to produce said modified instructions; and further including sequencing means responsive to said sequencing field for providing address information for accessing the successive microinstruction portions identified thereby.

3. In a data processing system in accordance with claim 2 wherein said plurality of microinstruction portions further contain a selection field providing said identification signals for selecting one of said plurality of microinstructions to be provided by said first control store means.

4. In a data processing system in accordance with claim 3 wherein said first control store means is a read-only-memory.

5. In a data processing system in accordance with claim 3 wherein said second control store means is a read-only-memory.

6. In a data processing system in accordance with claim 2 or 4 wherein said sequencing means comprises a sequencer program counter means for supplying said address information; and multiplexer means responsive to a plurality of input control signals from said second control store means for providing a selected control output signal generated in response to other information contained in said sequencing field of said microinstruction portions for controlling the operation of said sequencer program counter means.

7. In a data processing system in accordance with claim 1 wherein said modification means comprises one or more multiplexer means each responsive to a respective selected one of the fields of said one or more microinstructions provided by said first control store means and to a respective selected one of said modifier fields of said microinstruction portions provided by said second control store means, the outputs of each of said multiplexer means forming said modified output microinstructions.

8. In a data processing system requiring the generation of microinstructions for performing data processing operations and including:

a central processor unit having means responsive to macroinstructions for providing decoded macroinstructions for use in generating one or more microinstructions, said central processor unit further including first control store means for storing a plurality of first microinstructions, selected fields of which are capable of modification;

second control store means for storing a plurality of microinstruction portions, a first microinstruction portion identifying selected ones of said plurality of first microinstructions for readout thereof and a second microinstruction portion including two modifier fields of information usable for modifying said selected fields of said plurality of first microinstructions, said second control store means being responsive to said decoded macroinstructions for producing said plurality of microinstruction portions; and modification means responsive to the selected ones of said plurality of first microinstructions selected by the first microinstruction portion provided by said second control store means and responsive to at least one of said modifier fields for providing output microinstructions one or more selected fields of which are modified by said one or more modifier fields.

9. In a digital data system directed by macroinstructions, control means for providing microinstructions from a control store means for controlling operation of said data system, said control means comprising:

microinstruction control means responsive to each one of said macroinstructions for providing one or a sequence of more than one microinstruction control words, each one of said microinstruction control words including an address field used for selecting one of said microinstructions and a modifier field used from a control store means for selectively modifying said selected one of said microinstructions, and modification means responsive to said modifier field of said control words for selectively modifying said selected one of said microinstructions and providing modified microinstructions to control said data system operations.

10. In a digital data system, a method for providing microinstructions for controlling data system operations directed by macroinstructions, comprising the steps of:

storing one or a sequence of more than one microinstruction control words in a microinstruction control means, each one of said sequences related to one of said macroinstructions and each one of said control words having an address field and a modifier field;

storing said microinstructions in a control store means;

addressing said microinstruction control means with said macroinstructions to obtain one or a sequence of more than one of said control words;

addressing said control store means with the address field of said each of said control words to obtain microinstructions corresponding thereto;

selectively modifying said corresponding microinstructions with the modifier field of its corresponding control word; and providing said selectively modified microinstructions to said data system to control said data system operations.

* * * * *

UNITED STATES PATENT AND TRADEMARK OFFICE
CERTIFICATE OF CORRECTION

PATENT NO. : 4,394,736

DATED : July 19, 1983

INVENTOR(S) : David H. Bernstein, Richard A. Carberry, Michael B. Druke and Ronald I. Gusuwski.

It is certified that error appears in the above-identified patent and that said Letters Patent are hereby corrected as shown below:

Col. 33 before line 1 insert the following paragraph:

--In a data processing system requiring the generation of microinstructions for performing data processing operations and including:--.

Signed and Sealed this

Fifth Day of February 1985

[SEAL]

Attest:

DONALD J. QUIGG

*Attesting Officer*     *Acting Commissioner of Patents and Trademarks*